(12) United States Patent
Cochet et al.

(10) Patent No.: US 12,088,314 B2
(45) Date of Patent: Sep. 10, 2024

(54) SEGMENTED DIGITAL-TO-ANALOG CONVERTER WIRELINE DRIVER

(71) Applicant: International Business Machines Corporation, Armonk, NY (US)

(72) Inventors: Martin Cochet, South Salem, NY (US); Marcel A. Kossel, Reichenburg (CH); John Francis Bulzacchelli, Somers, NY (US); Timothy O. Dickson, Ridgefield, CT (US); Zeynep Toprak-Deniz, Woodbridge, CT (US)

(73) Assignee: International Business Machines Corporation, Armonk, NY (US)

( * ) Notice: Subject to any disclaimer, the term of this patent is extended or adjusted under 35 U.S.C. 154(b) by 73 days.

(21) Appl. No.: 17/839,141

(22) Filed: Jun. 13, 2022

(65) Prior Publication Data

US 2023/0403020 A1 Dec. 14, 2023

(51) Int. Cl.
*H03M 1/10* (2006.01)

(52) U.S. Cl.
CPC ................................ *H03M 1/1014* (2013.01)

(58) Field of Classification Search
None
See application file for complete search history.

(56) References Cited

U.S. PATENT DOCUMENTS

| | | |
|---|---|---|
| 5,554,986 A * | 9/1996 | Neidorff ............... H03M 1/682 341/145 |
| 7,368,902 B2 | 5/2008 | Clements |
| 7,570,071 B2 | 8/2009 | Clements |
| 8,618,833 B1 | 12/2013 | Bergkvist, Jr. |
| 8,866,658 B2 * | 10/2014 | Hirai ..................... H03M 1/682 341/145 |
| 8,878,568 B1 | 11/2014 | Farzan |
| 8,963,641 B1 | 2/2015 | Liu |
| 8,989,254 B2 | 3/2015 | Jing |

(Continued)

OTHER PUBLICATIONS

Kaviani et al.; "A 0.4-mW/GB/s Near-Ground Receiver Front-End With Replica Transconductance Termination Calibration for a 16 GB/s Source-Series Teminated Transceiver", JSSC IEEE Journal Of, vol. 48, No. 3, pp. 636-648, Mar. 2013.

(Continued)

*Primary Examiner* — Jeffrey S Zweizig
(74) *Attorney, Agent, or Firm* — Daniel Morris; Otterstedt & Kammer PLLC

(57) ABSTRACT

An apparatus comprises one or more A-type resistance segments, wherein each A-type resistance segment comprises one or more A-type switches, at least one A-type linear resistor coupled to the one or more A-type switches, at least one A-type tunable header unit coupled to the one or more A-type switches, and at least one A-type tunable footer unit coupled to the one or more A-type switches; one or more B-type resistance segments, wherein each B-type resistance segment comprises one or more B-type switches, at least one B-type linear resistor coupled to at least a proper subset of the one or more B-type switches, at least one B-type tunable header unit coupled to the one or more B-type switches, and at least one B-type tunable footer unit coupled to the one or more B-type switches; and wherein second terminals of the A-type linear resistors and the B-type linear resistors are coupled together.

19 Claims, 12 Drawing Sheets

(56) References Cited

U.S. PATENT DOCUMENTS

| | | | |
|---|---|---|---|
| 9,210,011 | B2 | 12/2015 | Rinaldi |
| 9,455,713 | B1 | 9/2016 | Kadkol |
| 10,257,121 | B1 | 4/2019 | Qin |
| 10,284,363 | B2 | 5/2019 | Dickson |
| 10,566,990 | B2 * | 2/2020 | Luo .................. H03M 1/68 |
| 10,826,536 | B1 | 11/2020 | Beukema |
| 10,985,759 | B2 | 4/2021 | Den Besten |
| 2020/0295976 | A1 | 9/2020 | Kobayashi |

OTHER PUBLICATIONS

Bai et al.; "A 1.89mW/Gbps SST Transmitter With Three-Tap FFE and Impedance Calibration", IEICE Electronics Express, vol. 16, No. 15, pp. 1-5, Jul. 1, 2019.

Chong et al.; "A 112Gb/s PAM-4, 168Gb/s PAM-8 7bit DAC-Based Transmitter in 7nm FinFET", ESSCIRC IEEE 47th European Conference On, pp. 1-4, Sep. 13-22, 2021.

Menolfi et al.; "A 28Gb/s Source-Series Terminated TX in 32nm CMOS SOI", ISSCC IEEE International Conference On, pp. 1-26, Feb. 19-23, 2012.

Chen et al.; "A Novel SST Transmitter With Mutually Decoupled Impedance Self-Calibration and Equalization", ISCAS IEEE Inter. Symposium On, pp. 173-176, May 15-18, 2011.

K. L. Chan et al., "A 32.75-GB/s Voltage-Mode Transmitter With Three-Tap FFE in 16-nm CMOS," in IEEE Journal of Solid-State Circuits, vol. 52, No. 10, pp. 2663-2678, Oct. 2017, doi: 10.1109/JSSC.2017.2714180.

Tan, K. H., Chiang, P.-C., Wang, Y., Zhao, H., Roldan, A., Zhao, H., Narang, N., Lim, S. W., Carey, D., Chaitanya Ambatipudi, S. L., Upadhyaya, P., Frans, Y., Chang, K. (2018). A 112-GB/s PAM4 transmitter in 16nm finfet. 2018 IEEE Symposium on VLSI Circuits. https://doi.org/10.1109/vlsic.2018.8502273.

Kossel MA, Khatri V, Braendli M, Francese PA, Morf T, Yonar SA, Prathapan M, Lukes EJ, Richetta RA, Cox C. 8.3 An Bb DAC-based SST TX using metal gate resistors with 1.4 pJ/b efficiency at 112Gb/s PAM-4 and 8-tap FFE in 7nm CMOS. In2021 IEEE International Solid-State Circuits Conference (ISSCC) Feb. 13, 2021 (vol. 64, pp. 130-132). IEEE.

ISR and Written Opinion of the International Searching Authority, counterpart PCT Application PCT/EP2023/064544, EPO as ISA, Authorized Officer Michael Jespers, mailed Sep. 22, 2023, 11 pages total.

Timothy Dickson et al., "A 72GS/s, 8-bit DAC-based Wireline Transmitter in 4nm FinFET CMOS for 200+GB/s Serial Links," believed presented at the 2022 IEEE Symposium on VLSI Technology and Circuits (VLSI Technology and Circuits) on Jun. 14, 2022 in Honolulu, Hawaii, USA, paper added to IEEE Xplore on Jul. 22, 2022, IEEE web site indicates conference began Jun. 12, 2022, Technical paper digest indicates conference began Jun. 13, 2022.

Timothy Dickson et al., "A 72GS/s, 8-bit DAC-based Wireline Transmitter in 4nm FinFET CMOS for 200+GB/s Serial Links," IEEE web site indicating conference began Jun. 12, 2022, 3 pages.

Timothy Dickson et al., "A 72GS/s, 8-bit DAC-based Wireline Transmitter in 4nm FinFET CMOS for 200+GB/s Serial Links," Technical paper digest cover indicating conference began Jun. 13, 2022, 1 page.

* cited by examiner

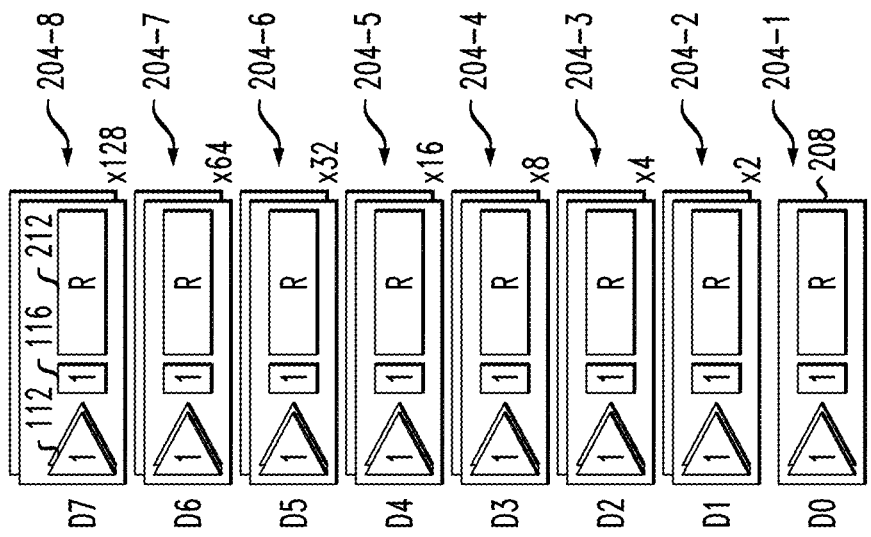
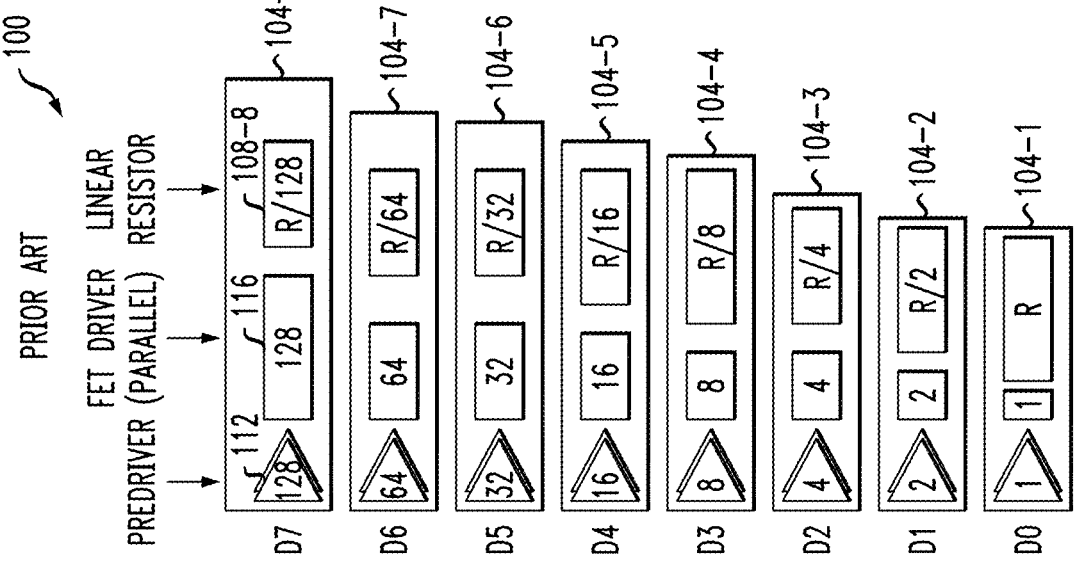

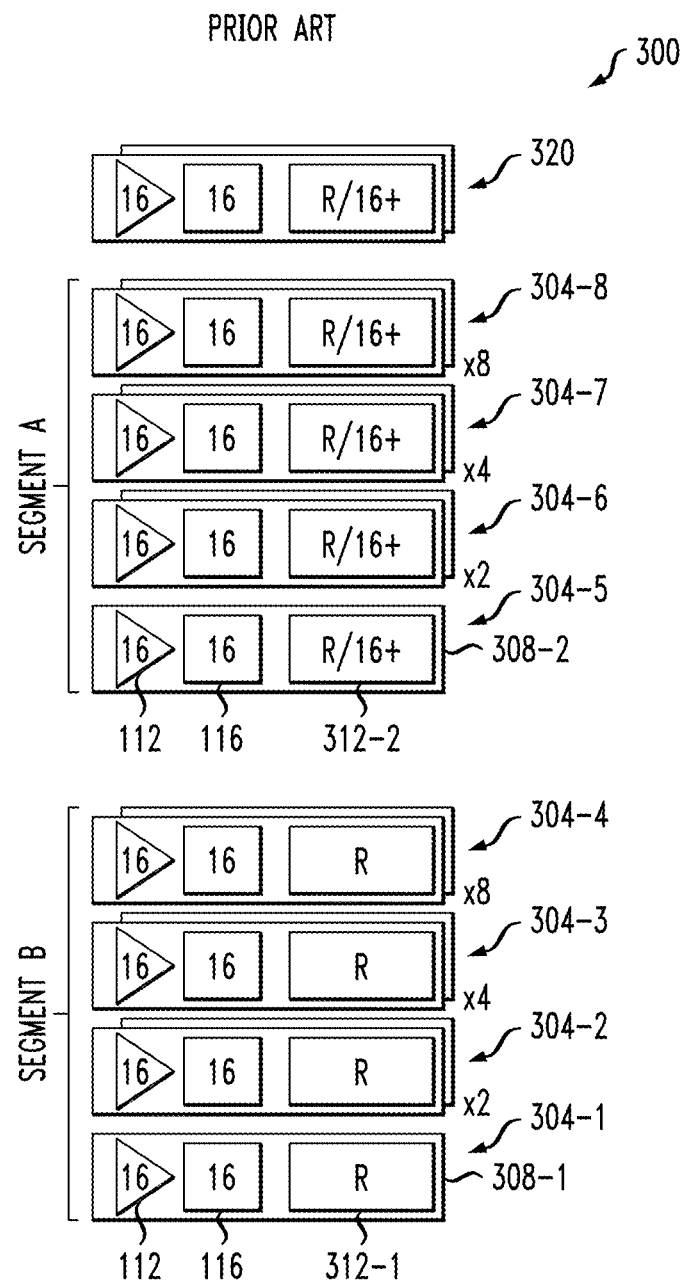

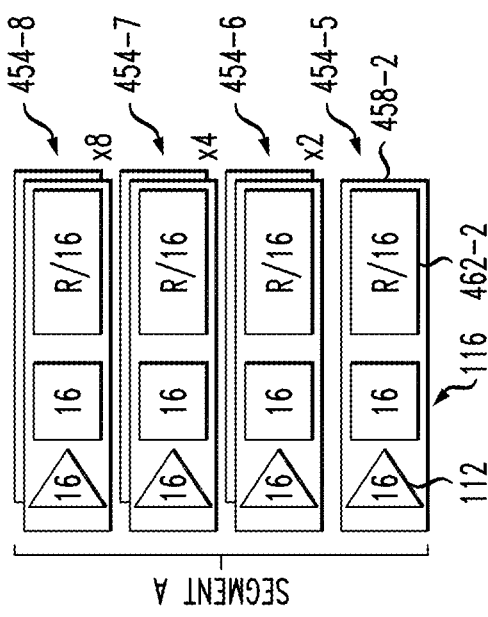
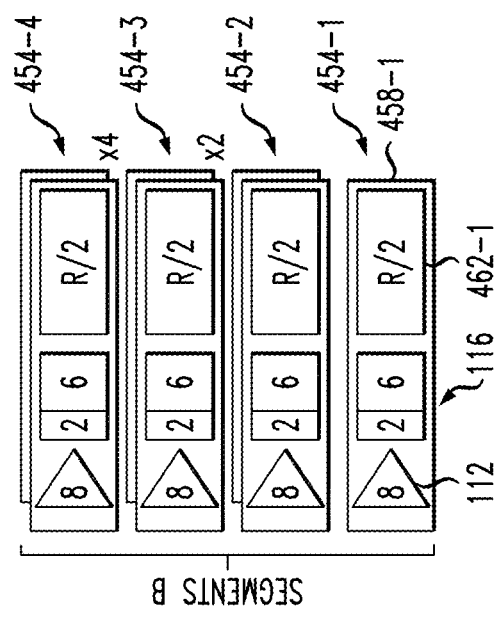
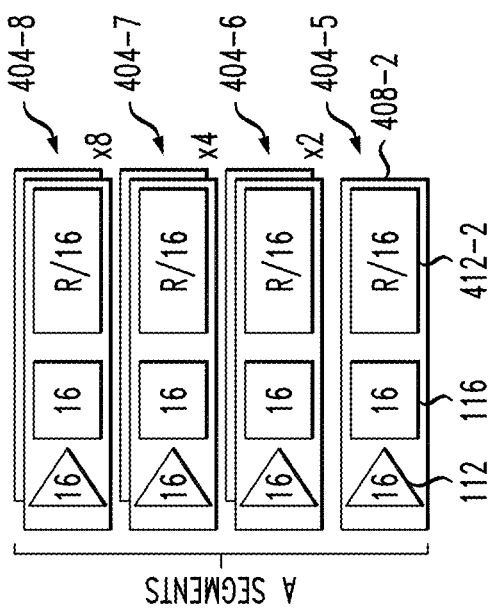
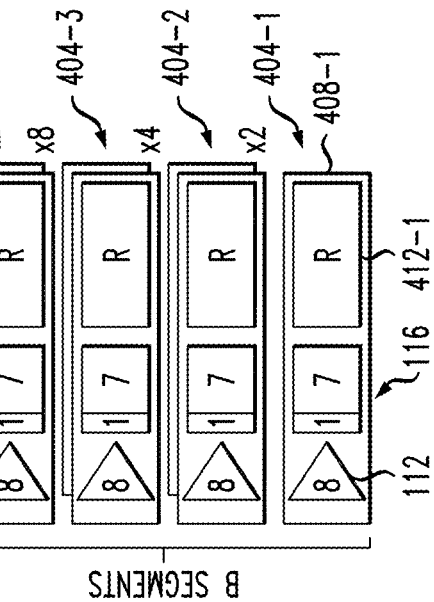

FIG. 5A
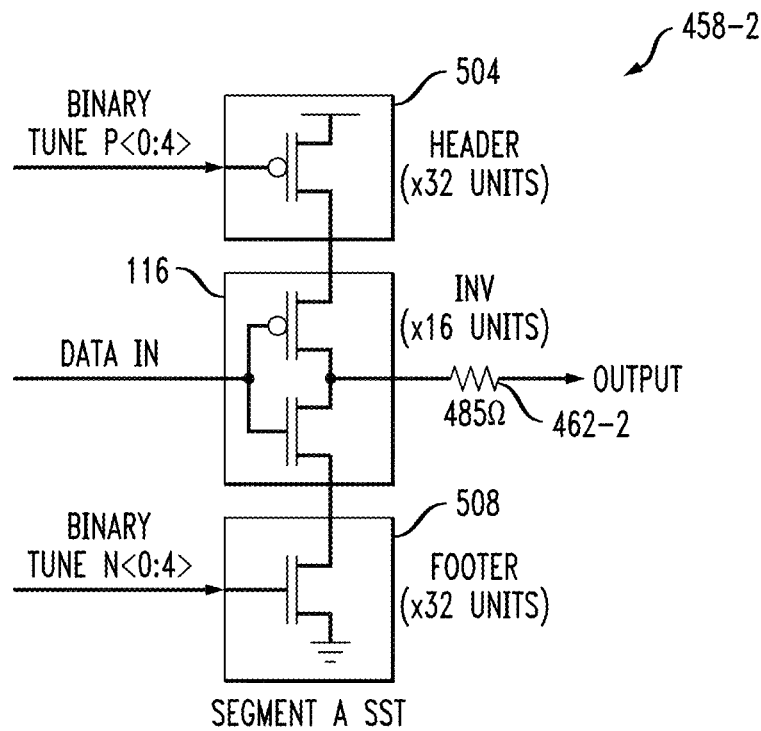
SEGMENT A SST
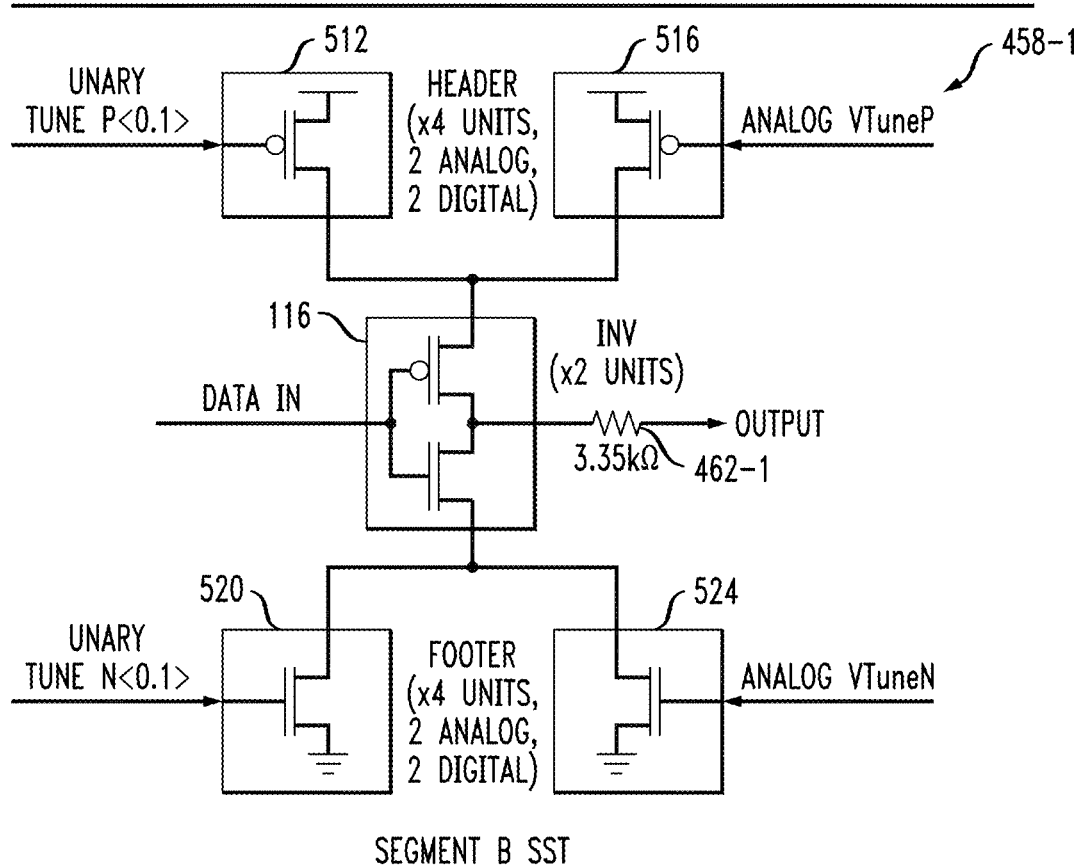
SEGMENT B SST

854 — SET ALL A-TYPE RESISTANCE SEGMENTS TO 1, SET ALL B-TYPE RESISTANCE SEGMENTS TO Z, FORCE THE OUTPUT TO $V_{DD}/2$, AND MEASURE THE CURRENT $I_{out}$, WHERE $Z_{out} = V_{DD}/2 * I_{out}$

858 — SET ALL A-TYPE RESISTANCE SEGMENTS TO 0, SET ALL B-TYPE RESISTANCE SEGMENTS TO Z, FORCE THE OUTPUT TO $V_{DD}/2$, AND MEASURE THE CURRENT $I_{out}$, WHERE $Z_{out} = V_{DD}/2 * I_{out}$

862 — SET ONE A-TYPE RESISTANCE SEGMENT TO 1, SET REMAINING A-TYPE RESISTANCE SEGMENTS TO Z, SET ALL B-TYPE RESISTANCE SEGMENTS TO 0, FORCE THE OUTPUT TO $V_{DD}/2$, MEASURE THE CURRENT $I_{out}$, AND ADJUST THE B-TYPE RESISTANCE SEGMENTS

866 — SET ONE A-TYPE RESISTANCE SEGMENT TO 0, SET REMAINING A-TYPE RESISTANCE SEGMENTS TO Z, SET ALL B-TYPE RESISTANCE SEGMENTS TO 1, FORCE THE OUTPUT TO $V_{DD}/2$, MEASURE THE CURRENT $I_{out}$, AND ADJUST THE B-TYPE RESISTANCE SEGMENTS

SEGMENTED DIGITAL-TO-ANALOG CONVERTER WIRELINE DRIVER

BACKGROUND

The present invention relates to the electrical, electronic and computer arts, and more specifically, to digital-to-analog converters (DACs) and wireline drivers.

High-speed wireline transmitters (TX) are often based on source-series-terminated (SST) DAC drivers. Each input bit ($d_0, \ldots, d_{N-1}$) of the DAC controls the connection of a corresponding binary-scaled resistor. In the case of an 8-bit DAC and a line impedance $R_0$ of 50Ω, the needed resistance per bit ranges from 50Ω*255=12,750Ω to 12,750Ω/128=99.6Ω. Conventionally, a DAC wireline SST driver is based on a plurality of resistance segments, where each resistance segment includes a linear resistor component and a switch, typically implemented with a field-effect transistor (FET), for control and tuning. In a naïve approach for building resistance segments, a unit corresponding to a least significant bit (LSB) of 12,750Ω is instantiated 255 times to generate the eight resistance segments of the DAC, where each resistance segment corresponds to a different bit of the DAC and therefore includes a different number of the instantiated units and a different total resistance value. This approach, however, consumes a large area of the device and consumes a large amount of power.

SUMMARY

Principles of the invention provide techniques for segmented digital-to-analog converter wireline drivers. In one aspect, an exemplary method includes the operations of enabling one or more A-type resistance segments, each A-type resistance segment comprising one or more A-type switches, and at least one A-type linear resistor coupled to the one or more A-type switches via a first terminal of the at least one A-type linear resistor; calibrating an impedance of the one or more A-type resistance segments to match a first given impedance; enabling one or more B-type resistance segments, each B-type resistance segment comprising one or more B-type switches, and at least one B-type linear resistor coupled to a proper subset of the one or more B-type switches via a first terminal of the at least one B-type linear resistor; and calibrating an impedance of the one or more B-type resistance segments to match a second given impedance.

In one aspect, an apparatus comprises one or more A-type resistance segments, wherein each A-type resistance segment comprises one or more A-type switches, at least one A-type linear resistor coupled to the one or more A-type switches via a first terminal of the at least one A-type linear resistor, at least one A-type tunable header unit coupled to the one or more A-type switches via a first terminal of the at least one A-type tunable header unit and coupled to a first supply via a second terminal of the at least one A-type tunable header unit, and at least one A-type tunable footer unit coupled to the one or more A-type switches via a first terminal of the at least one A-type tunable footer unit and coupled to a second supply via a second terminal of the at least one A-type tunable footer unit, wherein the at least one A-type tunable footer unit and the at least one A-type tunable header unit provide a tuning range sufficient to match an impedance of each A-type resistance segment to a first given impedance; one or more B-type resistance segments, wherein each B-type resistance segment comprises one or more B-type switches, and at least one B-type linear resistor coupled to at least a proper subset of the one or more B-type switches via a first terminal of the at least one B-type linear resistor, at least one B-type tunable header unit coupled to the one or more B-type switches via a first terminal of the at least one B-type tunable header unit and coupled to the first supply via a second terminal of the at least one B-type tunable header unit, and at least one B-type tunable footer unit coupled to the one or more B-type switches via a first terminal of the at least one B-type tunable footer unit and coupled to the second supply via a second terminal of the at least one B-type tunable footer unit, wherein the at least one B-type tunable footer unit and the at least one B-type tunable header unit provide a tuning range sufficient to match an impedance of each B-type resistance segment to a second given impedance; wherein the one or more A-type resistance segments implement k most significant bits of an N-bit digital-to-analog converter of the apparatus and the one or more B-type resistance segments implement N-k least significant bits of the N-bit digital-to-analog converter, wherein a resistance value of the at least one A-type linear resistor and a resistance value of the at least one B-type linear resistor are unequal, and wherein second terminals of the at least one A-type linear resistor and the at least one B-type linear resistor are coupled together.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in hardware such as digital circuitry. Some aspects (e.g., design process/design structures of FIG. 10) can be implemented in the form of a computer program product including a computer readable storage medium with computer usable program code for performing the method steps indicated/describing circuit(s) as disclosed. The software can then be executed on a system (or apparatus) including a memory, and at least one processor that is coupled to the memory.

Techniques of the present invention can provide substantial beneficial technical effects. For example, one or more embodiments provide one or more of:

1) eliminates requirement of calibration at each bit level individually, as with a naïve configuration having binary-scaled linear resistors;
2) sufficient tuning range on the least significant bit(s) of the DAC circuit as a result of, for example, hybrid analog-digital tuning;
3) reduced area size of the DAC circuit and provisioning of absolute impedance matching as compared to a naïve approach having identical linear resistors;
4) no need for undriven resistance segments which increase loading and decrease output swing of the DAC wireline driver, as with conventional approaches;
5) better resistance segment dynamic impedance matching with the same FET/linear resistor ratio, i.e., the same resistance-capacitance (RC) time constant between A-type segments and B-type segments, as compared with conventional approaches; and
6) additional benefits of reduced DAC power and area, and better impedance matching between the A-type segments and B-type segments of the DAC circuit as a result of implementing the least significant bit of the DAC circuit in a single-ended manner.

These and other features and advantages of the present invention will become apparent from the following detailed description of illustrative embodiments thereof, which is to be read in connection with the accompanying drawings.

BRIEF DESCRIPTION OF THE DRAWINGS

FIG. 1 illustrates a first conventional configuration for building resistance segments of a DAC wireline driver;

FIG. 2 illustrates a second conventional configuration for building resistance segments of a DAC wireline driver;

FIG. 3 illustrates a third conventional configuration for building resistance segments of a DAC wireline driver;

FIG. 4A illustrates a first example configuration for building resistance segments utilizing two types of resistance units, in accordance with an example embodiment;

FIG. 4B illustrates a second example configuration for building resistance segments utilizing two types of resistance units, in accordance with an example embodiment;

FIG. 5A is a schematic diagram of resistance units for the configuration of FIG. 4B, in accordance with an example embodiment;

FIG. 8 is a flowchart for an example method for calibrating a DAC wireline driver, in accordance with an example embodiment.

DETAILED DESCRIPTION

Figure 5B:
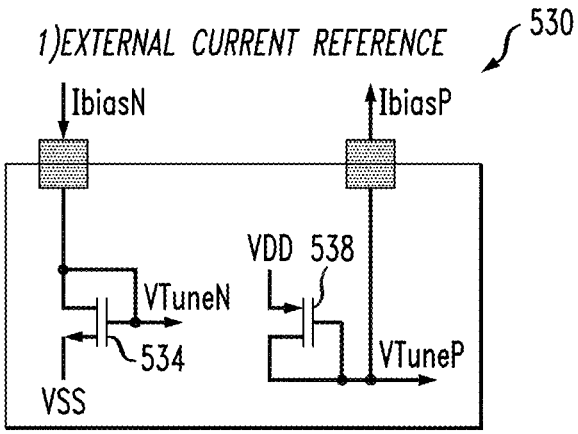
FIG. 5B is a schematic diagram of an example external current reference circuit for generating the analog tune signals (VTuneN and VTuneP), in accordance with an example embodiment.

Generally, digital-to-analog converter (DAC) wireline drivers and corresponding calibration methods are disclosed. As noted above, high-speed wireline transmitters (TX) are often based on source-series-terminated (SST) DAC drivers. Each input bit ($d_0, \ldots, d_{N-1}$) of the DAC controls the connection of a corresponding binary-scaled resistor. In the case of an 8-bit DAC and a line resistance $R_0$ of 50Ω, the needed resistance per bit ranges from 50 Ω*255=12,750Ω to 12,750Ω/128=99.6Ω. Conventionally, a DAC wireline driver is based on a plurality of resistance segments, where each resistance segment includes a linear resistor component and a switch, typically implemented with a field-effect transistor (FET), for control and tuning.

FIG. 1 illustrates a first conventional configuration 100 for building resistance segments of a DAC wireline driver. The example of FIG. 1 is a naïve approach that utilizes eight different binary-scaled resistance segments 104-1, 104-2, 104-3, 104-4, 104-5, 104-6, 104-7, 104-8 having different scaled resistance values implemented with linear resistors, such as linear resistor 108-8. For example, resistance segment 104-1 has a resistance of R and resistance segment 104-8 has a resistance of R/128. Each resistance segment 104-1, 104-2, 104-3, 104-4, 104-5, 104-6, 104-7, 104-8 also includes one or more predrivers, such as 128 predrivers 112 of resistance segment 104-8, to predrive the corresponding input bit of the DAC circuit and one or more switches, such as 128 switches 116 of resistance segment 104-8, to drive the corresponding linear resistor, such as linear resistor 108-8. In one example embodiment, the number of predrivers 112 and switches 116 in each resistance segment 104-1, 104-2, 104-3, 104-4, 104-5, 104-6, 104-7, 104-8 is also binary-scaled, where the number in the predriver 112 and the switch 116, as illustrated in FIG. 1, indicates the quantity of the corresponding component that is configured in parallel.

The configuration 100 exhibits a layout-related mismatch between the resistance segments 104-1, 104-2, 104-3, 104-4, 104-5, 104-6, 104-7, 104-8 because of the large difference in resistance values, ranging from R to R/128. This can create static differential non-linearity (DNL) due to a mismatch between the different resistance values of the different resistance segments 104-1, 104-2, 104-3, 104-4, 104-5, 104-6, 104-7, 104-8. This can also cause a dynamic performance mismatch between the resistance segments 104-1, 104-2, 104-3, 104-4, 104-5, 104-6, 104-7, 104-8, causing unbalanced transition times between the resistance segments 104-1, 104-2, 104-3, 104-4, 104-5, 104-6, 104-7, 104-8 and degrading the transmitter output eye opening. Tuning of the resistance segments 104-1, 104-2, 104-3, 104-4, 104-5, 104-6, 104-7, 104-8 to their target absolute value $Z_0*(2^n-1)$ (for example $Z_0*127$ for the resistance segment 104-1) is desired to guarantee a) that a specified absolute global impedance of the wireline driver, such as 50Ω, is attained, and b) impedance matching between the resistance segments 104-1, 104-2, 104-3, 104-4, 104-5, 104-6, 104-7, 104-8 impacting differential nonlinearity (DNL) and integral non-linearity (INL). Note that the FET switch 116 of the resistance segment 104-1 is of small size (that is, just one FET) represented with a value of 1 in the switch 116 symbol in FIG. 1); hence, its tunability (e.g., by digital control) is limited in practice since there is only one switch 116 to control.

FIG. 2 illustrates a second conventional configuration 200 for building resistance segments of a DAC wireline driver. Each resistance segment 204-1, 204-2, 204-3, 204-4, 204-5, 204-6, 204-7, 204-8 utilizes a different number of resistance units 208, each resistance unit 208 having a linear resistor 212 characterized by the same resistance value R; the resistance segments 204-1, 204-2, 204-3, 204-4, 204-5, 204-6, 204-7, 204-8 are therefore more easily impedance matched since they utilize linear resistors 212 characterized by the same resistance value R. To address the binary-scaling of a DAC, the number of resistance units 208 for each resistance segment 204-1, 204-2, 204-3, 204-4, 204-5, 204-6, 204-7, 204-8 is binary-scaled. Thus, resistance segment 204-1 has one resistance unit 208 and resistance segment 204-8 has 128 resistance units 208 in parallel. In addition to a linear resistor 212, each resistance unit 208 has a predriver 112 and a switch 116. With the configuration 200, the segments are matched to each other by construction (as the same resistance value R is used), but the switch 116 is of small size (just one FET as represented with a value of 1 in the switch 116 symbol of FIG. 2); hence, its tunability is limited in practice, similar to the tunability issue encountered previously with the resistance segment 104-1 of the configuration 100. In addition, the implementation becomes large and inefficient for large numbers of bits handled by the DAC due to the binary scaling of the resistance segments 204-1, 204-2, 204-3, 204-4, 204-5, 204-6, 204-7, 204-8.

FIG. 3 illustrates a third conventional configuration 300 for building resistance segments of a DAC wireline driver. The configuration 300 utilizes two types of resistance units 308-1, 308-2. Each resistance segment 304-1, 304-2, 304-3, 304-4 (referred to as B-type resistance segments and B-type segments herein) utilizes a B-type resistance unit 308-1 and each resistance segment 304-5, 304-6, 304-7, 304-8 (referred to as A-type resistance segments and A-type segments herein) utilizes an A-type resistance unit 308-2. Each A-type resistance unit 308-2 has a linear resistor 312-2 characterized by the same resistance value R/16+ (i.e., a value equal to R divided by a number larger than 16) and each B-type resistance unit 308-1 has a linear resistor 312-1 characterized by the same resistance value R. (Note that the term "R/16+" refers to a resistance value for resistor 312-2 and not a mathematical formula.) The exact value of R/16+ can be computed in the following way: denoting RA as the resistance of an A-type resistance unit 308-2, RB as the resistance of a B-type resistance unit 308-1, and RFET as the resistance of 16 switches 116 in parallel, then RB=RFET+R and RA=RFET+R/16+. To attain the desired ratio RB/RA=16, R/16+ is determined according to R/16+=R/16−(15/16)*RFET.) The resistance segments 304-1, 304-2, 304-3, 304-4, 304-5, 304-6, 304-7, 304-8 are more easily matched since they utilize linear resistors 312-1, 312-2 characterized by the fact that the resistance values do not vary as much as the resistance values of the resistance segments 104-1, 104-2, 104-3, 104-4, 104-5, 104-6, 104-7, 104-8 of FIG. 1 and since the A-type segments 304-5, 304-6, 304-7, 304-8 can be tuned to match the B-type segments 304-1, 304-2, 304-3, 304-4 (although there is a limited tuning range for the B-type segments 304-1, 304-2, 304-3, 304-4). To address the binary-scaling characteristic of a DAC, the number of resistance units 308-1, 308-2 for each resistance segment 304-1, 304-2, 304-3, 304-4, 304-5, 304-6, 304-7, 304-8 is binary-scaled, taking into consideration the scaling of the linear resistors 312-1, 312-2. Thus, for example, the resistance segment 304-1 has one resistance unit 308-1, the resistance segment 304-4 has eight resistance units 308-1, the resistance segment 304-5 has one resistance unit 308-2, and the resistance segment 304-8 has 8 resistance units 308-2 in parallel. Due to the use of distinct A-type resistance segments 304-5, 304-6, 304-7, 304-8 and B-type resistance segments 304-1, 304-2, 304-3, 304-4, only eight resistance units 308-2 are needed to implement the resistance segment 304-8, in contrast with the 128 resistance units 208 needed to implement the resistance segment 204-8 of FIG. 2. Compared with the pure unit cell approach shown in FIG. 2, the use of distinct A-type resistance segments 304-5, 304-6, 304-7, 304-8 and B-type resistance segments 304-1, 304-2, 304-3, 304-4 improves circuit efficiency, saving significant area and power. In addition to a linear resistor 312-1, 312-2, each resistance unit 308-1, 308-2 has 16 predrivers 112 and 16 switches 116 in parallel. Thus, the corresponding linear resistor 312-1, 312-2 can be driven by between 0 and 16 switches. The outputs of the predrivers 112 of each resistance unit 308-1, 308-2 are shorted together to form a single net driving the input of all the switches 116.

An additional undriven impedance, implemented using an undriven segment 320 constructed of a plurality of A-type resistance units 308-2, is also provisioned for calibration of the DAC. (The A-type resistance units 308-2 of the undriven segment 320 are not connected to an input data signal; the A-type resistance units 308-2 of the undriven segment 320 are either left floating or connected to a static signal. The values of the static signals can be chosen to be balanced between the A-type resistance units 308-2 in order to minimally affect the common mode output. For example, if four undriven A-type resistance units 308-2 need to be enabled for impedance matching, two can be connected to Vss and two connected to Vdd. The provisioning of 16 switches 116 in each resistance unit 308-1, 308-2 and the undriven segment 320 enable the calibration of the DAC over two dimensions, and an ability to provide a specified absolute global impedance, such as 1, and an impedance match between the resistance segments 304-1, 304-2, 304-3, 304-4, 304-5, 304-6, 304-7, 304-8. In one example embodiment, the A-type segments 304-5, 304-6, 304-7, 304-8 are first calibrated to match the B-type segments 304-1, 304-2, 304-3, 304-4, and then the undriven impedance 320 is tuned to match the total parallel impedance of the driver (i.e., the impedance formed by the parallel combination of the resistance segments 304-1, 304-2, 304-3, 304-4, 304-5, 304-6, 304-7, 304-8, and the undriven impedance 320) to the specified absolute global impedance by enabling the appropriate number of switches 116 in the undriven impedance 320. Specifically, the DAC is designed to have a nominal impedance larger than the target impedance, i.e., $$1 \Big/ \left( \frac{15}{RA} + \frac{15}{RB} \right) > Z_o = 50\,\Omega.$$

Then, k≥0 A-type resistance units 308-2 of the undriven segment 320 are enabled, where k is chosen so that $$1 \Big/ \left( \frac{15+k}{RA} + \frac{15}{RB} \right) = Z_o = 50\,\Omega.$$

In general, the drawbacks of the configuration 300 include the following:
  a) the tuning range of the B-type segments 304-1, 304-2, 304-3, 304-4 is very limited;
  b) because of the limited tuning range of the B-type segments 304-1, 304-2, 304-3, 304-4, the undriven impedance 320 is needed to attain the desired absolute global impedance, increasing the complexity and reducing the output swing of the DAC; and
  c) the different FET/linear resistor ratios between the A-type segments 304-5, 304-6, 304-7, 304-8 and the B-type segments 304-1, 304-2, 304-3, 304-4 causes a dynamic mismatch between the A-type segments 304-5, 304-6, 304-7, 304-8 and the B-type segments 304-1, 304-2, 304-3, 304-4.

KeeHian Tan et al., A 112-Gb/s PAM4 transmitter in 16 nm FinFET, in 2018 IEEE Symposium on VLSI Circuits 2018 Jun. 18 (pp. 45-46), IEEE (Tan et al.) use an analog (i.e., non-DAC) wireline transmitter with identical slices, but using analog fine tuning of the segment gate voltages. First, it is noted that the analog wireline transmitter with identical slices topology is different from a DAC-based wireline transmitter. The direct feed forward equalization (FFE) implementation can be energy efficient, but is not as flexible in terms of possible equalizations than that of a DAC-based wireline transmitter (TX). Moreover, the use of a fully analog control on the header and footer devices provides worse linearity of the FET resistance compared to a digital or hybrid control. This, in turn, results in a worse Integral Non-Linearity (INL) of the transmitter which degrades the link performance (e.g., a worse Relative Level Mismatch (RLM) in the case of a 4-level Pulse Amplitude Modulation (PAM4) case).

FIG. 4A illustrates a first example configuration 400 for building resistance segments utilizing two types of resistance units 408-1, 408-2, in accordance with an example embodiment. (Although two types of resistance units 408-1, 408-2 are illustrated in FIG. 4A, more than two types of resistance units may be utilized.) Each B-type resistance segment 404-1, 404-2, 404-3, 404-4 utilizes a different number of B-type resistance units 408-1 and each A-type resistance segment 404-5, 404-6, 404-7, 404-8 utilizes a different number of A-type resistance units 408-2. Each A-type resistance unit 408-2 has a linear resistor 412-2 characterized by the same resistance value R/16 and each B-type resistance unit 408-1 has a linear resistor 412-1 characterized by the same resistance value R; the resistance segments 404-1, 404-2, 404-3, 404-4, 404-5, 404-6, 404-7, 404-8 are more easily impedance matched since they utilize linear resistors 412-1, 412-2 characterized by the fact that the resistance values do not vary as much as the resistance values of the resistance segments 104-1, 104-2, 104-3, 104-4, 104-5, 104-6, 104-7, 104-8 of FIG. 1.

As with the example configuration 300, to address the binary-scaling characteristic of a DAC, the number of resistance units 408-1, 408-2 for each resistance segment 404-1, 404-2, 404-3, 404-4, 404-5, 404-6, 404-7, 404-8 is binary-scaled, taking into consideration the scaling of the linear resistors 412-1, 412-2. Thus, for example, the resistance segment 404-1 has one resistance unit 408-1, the resistance segment 404-4 has eight resistance units 408-1, the resistance segment 404-5 has one resistance unit 408-2, and the resistance segment 404-8 has 8 resistance units 408-2 in parallel. In addition to a linear resistor 412-1, each resistance unit 408-1 has 8 predrivers 112 and 8 switches 116 in parallel. The outputs of the predrivers 112 of each resistance unit 408-1 are shorted together to form a single net driving the input of all the switches 116. It is noted that all 8 switches 116 are connected to a corresponding predriver 112 to provide a matching of the loading of the predrivers 112, but 7 of the 8 switches 116 are not connected to the corresponding linear resistor 412-1. This makes the impedance ratio of the single driving switch 116 to the corresponding linear resistor 412-1 of the B-segment resistance units 408-1 equal to the impedance ratio of the driving switches 116 to the corresponding linear resistor 412-2 of the A-segment resistance units 408-2, and therefore the same tuning range is available for the resistance segments 404-1, 404-2, 404-3, 404-4, 404-5, 404-6, 404-7, 404-8. In one example embodiment, the A-type tuning circuit and the B-type tuning circuit provide comparable relative tuning ranges. In a non-limiting example, the A-type tuning circuit and the B-type tuning circuit provide tuning ranges within 2% of each other. With such a 2% matching between an A-type resistance segment and B-type resistance segment, and for a given 1:16 ratio between an A-type resistance segment and a B-type resistance segment as depicted in FIG. 4A, $RB=16*RA*(1+0.02)$ and the mismatch would result in a DNL of $0.02*16=0.32$ LSB which is typically acceptable for a transmitter DAC DNL. There is another advantage to making the impedance ratio of the single driving switch 116 to the corresponding linear resistor 412-1 of the B-type resistance units 408-1 equal to the impedance ratio of the driving switches 116 to the corresponding linear resistor 412-2 of the A-type resistance units 408-2. Because the device parasitic capacitance in the weaker B-type resistance segments is scaled down proportionally, the RC time constants in the A-type resistance segments and the B-type resistance segments are equal, and the dynamic performance is well-matched between the resistance segments 404-1, 404-2, 404-3, 404-4, 404-5, 404-6, 404-7, 404-8. Balancing the transition times between the resistance segments 404-1, 404-2, 404-3, 404-4, 404-5, 404-6, 404-7, 404-8 improves the transmitter output eye opening.

In addition to a linear resistor 412-2, each resistance unit 408-2 has 16 predrivers 112 and 16 switches 116 in parallel. In one or more embodiments, the B-type resistance units 408-1 and the A-type resistance units 408-2 utilize the same type of predrivers 112. The outputs of the predrivers 112 of each resistance unit 408-2 are shorted together to form a single net driving the input of all the switches 116. Thus, the corresponding linear resistor 412-2 can be driven by between 0 and 16 switches. The provisioning of 16 switches 116 in each resistance unit 408-2 enables the calibration of the DAC over two dimensions, and an ability to provide a specified absolute global impedance and an impedance match between the resistance segments 404-1, 404-2, 404-3, 404-4 having the B-type resistance units 408-1 and the resistance segments 404-5, 404-6, 404-7, 404-8 having the A-type resistance units 408-2. It is noted, however, that a hybrid approach of both digital and analog control of the calibration of the B-type resistance units 408-1 is utilized in one or more embodiments since there is only one active FET in each B-type resistance unit 408-1 and the tuning would be too coarse with a single-bit control, as described below in conjunction with FIGS. 5 and 6.

FIG. 4B illustrates a second example configuration 450 for building resistance segments utilizing two types of resistance units 458-1, 458-2, in accordance with an example embodiment. (Although two types of resistance units 458-1, 458-2 are illustrated in FIG. 4B, more than two types of resistance units may be utilized.) Each B-type resistance segment 454-1, 454-2, 454-3, 454-4 utilizes B-type resistance units 458-1 and each A-type resistance segment 454-5, 454-6, 454-7, 454-8 utilizes a different number of A-type resistance units 458-2. Each B-type resistance unit 458-1 has a linear resistor 462-1 characterized by the same resistance value R/2 and each A-type resistance unit 458-2 has a linear resistor 462-2 characterized by the same resistance value R/16; in one or more embodiments, it is easier (compared to the configuration 100 of FIG. 1) to impedance-match the resistance segments 454-1, 454-2, 454-3, 454-4, 454-5, 454-6, 454-7, 454-8, since they utilize linear resistors 462-1, 462-2 characterized by the fact that the resistance values do not vary as much as the resistance values of the resistance segments 104-1, 104-2, 104-3, 104-4, 104-5, 104-6, 104-7, 104-8 of FIG. 1.

As with the example configuration 400, to address the binary-scaling characteristic of a DAC, the number of resistance units 458-1, 458-2 for each resistance segment 454-1, 454-2, 454-3, 454-4, 454-5, 454-6, 454-7, 454-8 is varied, taking into consideration the scaling of the linear resistors

462-1, 462-2. Thus, for example, the resistance segment 454-1 has one resistance unit 458-1, the resistance segment 454-2 has one resistance unit 458-1, the resistance segment 454-3 has two resistance units 458-1, the resistance segment 454-4 has four resistance units 458-1, the resistance segment 454-5 has one resistance unit 458-2, the resistance segment 454-6 has two resistance units 458-2, the resistance segment 454-7 has four resistance units 458-2, and the resistance segment 454-8 has eight resistance units 458-2 in parallel.

In addition to a linear resistor 462-1, each resistance unit 458-1 has 8 predrivers 112 and 8 switches 116 in parallel. In one or more embodiments, the B-type resistance units 458-1 and the A-type resistance units 458-2 utilize the same type of predrivers 112. It is noted that all 8 of the switches 116 are connected to a corresponding predriver 112 to provide a matching of the loading of the predrivers 112, but 6 of the 8 switches 116 are not connected to the corresponding linear resistor 462-1. The outputs of the predrivers 112 of each resistance unit 458-1 are shorted together to form a single net driving the input of all the switches 116. This makes the impedance ratio of the two driving switches 116 to the linear resistor 462-1 of the B-type resistance unit 458-1 closer to the impedance ratio of the 16 driving switches 116 to the linear resistor 462-2 of the A-type resistance unit 458-2, and therefore provides a similar tuning range for the A-type resistance units 458-2 and the B-type resistance unit 458-1.

In addition to a linear resistor 462-2, each resistance unit 458-2 has 16 predrivers 112 and 16 switches 116 in parallel. Thus, the corresponding linear resistor 462-2 can be driven by between 0 and 16 switches. The provisioning of 16 switches 116 in each resistance unit 458-2 enables calibration of the DAC over two dimensions, and an ability to provide a specified absolute global impedance and an impedance match between the B-type resistance segments 454-1, 454-2, 454-3, 454-4 having the B-type resistance units 458-1 and A-type resistance segments 454-5, 454-6, 454-7, 454-8 having the A-type resistance units 458-2. It is noted, however, that a hybrid approach of both digital and analog control of the calibration of the B-type resistance units 458-1 is utilized in one or more embodiments. Although there are two active switches 116 in each B-type resistance unit 458-1 (as compared to one active switch 116 in each B-type resistance units 408-1), the tuning would still be too coarse with two bits of digital control, as described below in conjunction with FIGS. 5 and 6.

Single-Ended Least Significant Bit

In the configuration 400 of FIG. 4A, the 1:16 ratio between the A-type segments 404-5, 404-6, 404-7, 404-8 and the B-type segments 404-1, 404-2, 404-3, 404-4 uses a relatively large linear resistor 412-1 and uses substantial device area. The configuration 450 of FIG. 4B uses a 1:8 ratio between the A-type segments 454-5, 454-6, 454-7, 454-8 and the B-type segments 454-1, 454-2, 454-3, 454-4 and the resistance segment 454-1 corresponding to the least significant bit (LSB) of the DAC circuit is connected in a single-ended manner, while the most significant bit (A-type resistance segment 454-8) and the intermediate resistance segments 454-2, 454-3, 454-4, 454-5, 454-6, 454-7 are connected in a differential manner. This enables improved tuning by enabling the incorporation of two switches 116 per B-type resistance unit 458-1 and a smaller mismatch between the A-type segments 454-5, 454-6, 454-7, 454-8 and B-type segments 454-1, 454-2, 454-3, 454-4 due to the smaller spread of values in the linear resistors 462-1, 462-2. In an exemplary embodiment corresponding to configuration 450, pre-driver power is reduced by 16.7%, driver height is reduced by 23.3%, A/B segment drive ratio is reduced to reduce the impedance mismatch (16:1 to 8:1), and a B-type resistance unit resistor length is reduced by −50% (7.4 μm to 3.7 μm) compared to a design that does not use a single-ended LSB (i.e., the reference design has 15 B-type resistance units, each with 16× the A-type resistance units). The configuration 450 results in the addition of ½ LSB of common mode voltage (VCM) noise (which is negligible) and the offsetting of codes by ½ LSB (which can be handled by the receiver).

FIG. 5A is a schematic diagram of example resistance units 458-1, 458-2 for the configuration 450 of FIG. 4B, in accordance with an example embodiment. The calibration can be implemented either in-situ (that is, utilizing the DAC wireline driver that is being calibrated) or using an on-chip replica of a portion of the DAC wireline driver being calibrated. In one example embodiment, each A-type resistance unit 408-2, 458-2 is calibrated by 32 header units 504 configured in parallel and 32 footer units 508 configured in parallel (the junction of the 32 header units 504 and the 16 switches 116 is a single node and the junction of the 32 footer units 508 and the 16 switches 116 is a single node). The 32 header units 504 are controlled by a PMOS binary tune signal P<0:4> and the 32 footer units 508 are controlled by an NMOS binary tune signal N<0:4>. The value defined by P<0:4> and N<0:4> indicates the number of header units 504 and footer units 508, respectively, that are turned "ON." (The binary tune signals P<0:4> and N<0:4> are demultiplexed by, for example, a demultiplexer (not shown to avoid clutter; the implementation would be apparent to the skilled artisan given the teachings herein).) Thus, by varying the value defined by P<0:4> and N<0:4>, the specified absolute global impedance can be attained. The sizing of the header units 504 and footer units 508 (e.g., the 32 units of header units 504 and footer units 508 depicted in FIG. 5A) can be determined in conjunction with the sizing of the linear resistor 462-2 and the switch 116. The constraints are the following: a) the sum of the resistance of the header units 504 and footer units 508, switch 116, and the linear resistor 462-1 must be equal to the desired unit resistance (e.g. RA); b) the value of the linear resistor 462-1 should be maximized to improve driver linearity; c) the size of the switch 116 should be minimized to reduce input capacitance, hence power; and d) the header units 504 must have a large enough resistance tuning range to offer enough tuning to account for the variability of the linear resistor 462-1 and the resistance of the switch 116. Thus, FIG. 5A provides an exemplary circuit-level detail of one LSB segment of 450; elements 504, 508 plus the inverter INV correspond to 16 units 116. The resistance 3.35 kΩ corresponds to 462-1 and the resistance of 485Ω corresponds to 462-2; these values are exemplary and non-limiting (the skilled artisan can determine appropriate values for other applications, given the teachings herein).

In one example embodiment, each resistance unit 458-1 is calibrated by two header units 512 configured in parallel, two analog-controlled header units 516 configured in parallel, two footer units 520 configured in parallel, and two analog-controlled footer units 524 configured in parallel (the junction of the four header units 512, 516 and the 2 switches 116 is a single node and the junction of the footer units 520, 524 and the 2 switches 116 is a single node). The two header units 512 are controlled by a PMOS binary tune signal P<0:1> and the two footer units 520 are controlled by an NMOS binary tune signal N<0:1>. The value defined by P<0:1> and N<0:1> indicates the number header units 512 and footer units 520, respectively, that are turned "ON." (The binary tune signals P<0:1> and N<0:1> are each demultiplexed by, for example, a demultiplexer (not shown to avoid clutter; the implementation would be apparent to the skilled artisan given the teachings herein).) The two analog-controlled header units 516 are controlled by an analog tune signal (VTuneP) and the two analog-controlled footer units 524 are controlled by an analog tune signal (VTuneN). (The analog tune signal (VTuneP) and the analog tune signal (VTuneN) are each generated by, for example, a digital-to-analog converter (not shown to avoid clutter; the implementation would be apparent to the skilled artisan given the teachings herein).) The amplitude of the analog tune signal (VTuneP) and the amplitude of the analog tune signal (VTuneN) control the gates of the corresponding analog-controlled header units 516 and the corresponding analog-controlled footer units 524, respectively. Thus, by varying the amplitude of the value defined by the P<0:1> tune signal, the value defined by the N<0:1> tune signal, the amplitude of the analog tune signal (VTuneP), and the amplitude of the analog tune signal (VTuneN), the matching of the impedance between the resistance segments having the B-type resistance units 408-1, 458-1 and the A-type resistance units 408-2, 458-2 can be attained. It is noted that, while a pure analog control configuration of the B-type resistance units degrades the linearity of the DAC device and a pure digital control configuration of the B-type resistance units limits the tuning resolution, such configurations are contemplated and can be implemented in some embodiments In the example resistance units 458-1 of B-type resistance segment 454-1, there are four headers 512, 516 and four footers 520, 524 if a single-ended configuration is used for the LSB. In the example of resistance units 408-1 of B-type resistance segment 404-1, there are two headers 512, 516 and two footers 520, 524 if a differential configuration is used for the LSB.

It is noted that, if the active FET of the B-type resistance units 408-1, 458-1 is scaled down by $2^n$ compared to the A-type resistance units 408-2, 458-2, either a very large number of FETs would be required in the A-type resistance segments or there would be quantization limits in the B-type resistance segments. Also, analog control of the A-type resistance segments is not optimal as per-slice tuning would be more complex and the DAC linearity would be degraded; analog control of the B-type resistance segments is acceptable because the B-type resistance segments are a smaller contributor to the overall non-linearity of the DAC.

In one or more embodiments, more than two types of resistance units are utilized. For example, if a higher DAC precision is needed, three types of resistance units may be utilized. For example, a 9-bit DAC could be built using 7 A-type resistance units, 7 B-type resistance units, and 7 C-type resistance units, where the A-/B-/C-type resistance segments have the resistance ratios 1:8:64. In this case, the tuning method can be extended by implementing the tuning for the A-type resistance segments in a fully digital manner, the tuning for the B-type resistance segments in an hybrid manner, and the tuning for the C-type resistance segments in a fully analog manner. Other combinations of tuning types are contemplated.

FIG. 5B is a schematic diagram of an example external current reference circuit 530 for generating the analog tune signals (VTuneN and VTuneP), in accordance with an example embodiment. In one example embodiment, reference currents IbiasN and IbiasP are connected to a MOSFET catch diode (NMOS catch diode 534 for IbiasN and PMOS catch diode 538 for IbiasP). The catch diode 534, 538 is composed of a MOSFET with the drain connected to the gate. The reference current defines the MOSFET drain current, and the analog control voltages produced correspond to the resulting FET drain-source voltage VD S.

Figure 5C:
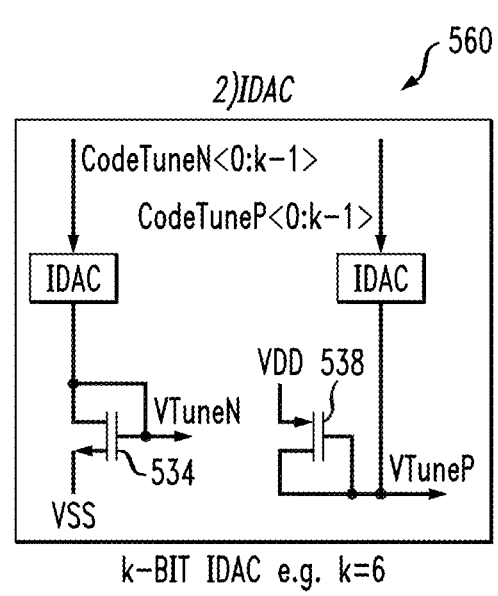
FIG. 5C is a schematic diagram of an example current-based digital-to-analog converter circuit for generating the analog tune signals (VTuneN and VTuneP), in accordance with an example embodiment.

FIG. 5C is a schematic diagram of an example current-based digital-to-analog converter circuit 560 for generating the analog tune signals (VTuneN and VTuneP), in accordance with an example embodiment. In one example embodiment, a plurality of digital control bits CodeTuneN<0:k–1> and CodeTuneP<0:k–1> are set to generate a specified amount of current that is used to generate the analog tune signals (VTuneN and VTuneP). The current-based digital-to-analog converter circuit 560 is similar in function to the external current reference circuit 530, except that the current-based digital-to-analog converter circuit 560 does not require external current references, making its integration more straightforward. Note that the IDAC resolution k should be chosen sufficiently large to limit the effect of the quantization steps (e.g., k=6 can be used).

Figure 5D:
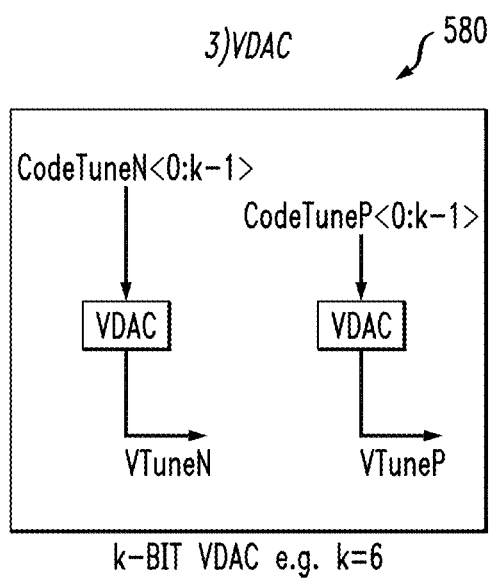
FIG. 5D is a schematic diagram of an example voltage-based digital-to-analog converter circuit for generating the analog tune signals (VTuneN and VTuneP), in accordance with an example embodiment.

FIG. 5D is a schematic diagram of an example voltage-based digital-to-analog converter circuit 580 for generating the analog tune signals (VTuneN and VTuneP), in accordance with an example embodiment. In one example embodiment, a plurality of digital control bits CodeTuneN<0:k–1> and CodeTuneP<0:k–1> are set to generate the analog tune signals directly (VTuneN and VTuneP). Note that the VDAC resolution k should be chosen sufficiently large to limit the effect of the quantization steps (e.g., k=6 can be used).

Figure 5E:
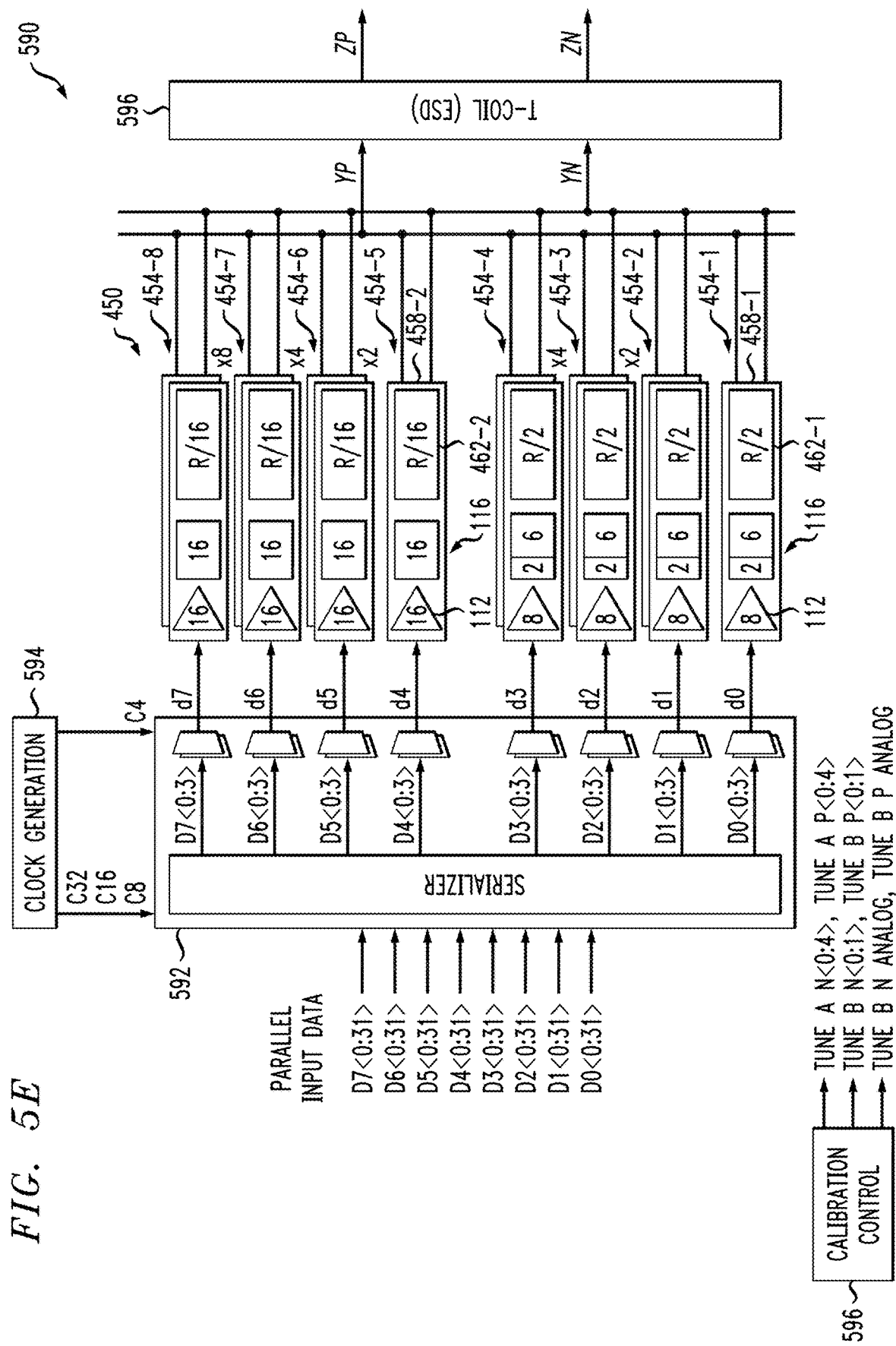
FIG. 5E is a block diagram of an example digital-to-analog converter wireline transmitter, in accordance with an example embodiment.

FIG. 5E is a block diagram of an example digital-to-analog converter wireline transmitter 590, in accordance with an example embodiment. In one example embodiment, the inputs to the A-type segments 454-5, 454-6, 454-7, 454-8 and the B-type segments 454-1, 454-2, 454-3, 454-4 are generated by a serializer 592 that serializes eight parallel 32-bit words <D7:D0> (a total of 256 parallel bits) to 8 parallel bits <d7:d0>. The serialization of the eight parallel 32-bit words <D7:D0> is controlled by four sub-rate clocks C32, C16, C8, C4 generated by a clock generation circuit 594, in a known manner. A calibration control circuit 596 includes a processor, a finite state machine or similar device and a tuning signal generation circuit (see FIGS. 5B-5D) for, e.g., generating tuning signals for the A-type segments 454-5, 454-6, 454-7, 454-8 and the B-type segments 454-1, 454-2, 454-3, 454-4. The outputs of the A-type segments 454-5, 454-6, 454-7, 454-8 and the B-type segments 454-1, 454-2, 454-3, 454-4 are coupled to a T-coil circuit 596 that includes an electrostatic discharge (ESD) circuit for generation of the differential output ZP and ZN of the digital-to-analog converter wireline driver 590.

Figure 6A:
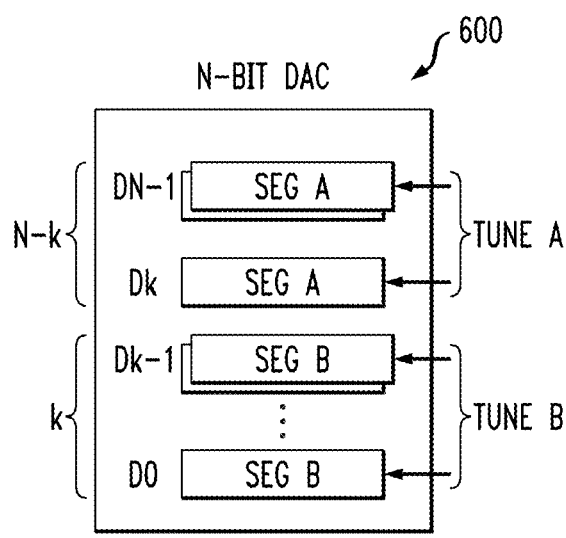
FIG. 6A is a high-level diagram for illustrating an example calibration strategy for the example configurations of FIGS. 4A and 4B, in accordance with an example embodiment.

FIG. 6A is a high-level diagram for illustrating an example calibration strategy 600 for the example configurations 400, 450 of FIGS. 4A and 4B, in accordance with an example embodiment. The N-k A-type segments are tuned separately from the k B-type segments. The A:B scaling is 1:2 k in configuration 400 where, as an example, N=8 and k=4). The $Z_0$ nominal full impedance is, for example, 50Ω. Nominally, one A-type resistance unit is defined by $$Z_0 * \frac{(2^N - 1)}{2^k}$$

and one B-type resistance unit is defined by $Z_0*(2^N-1)$ for configuration 400. In the configuration 450 (with a SE- LSB), the A-type resistance unit would be the same, but the A:B scaling is $1:2^{(k-1)}$ and one B-type resistance is defined as $$Z_0 * \frac{(2^N - 1)}{2}.$$

In one example embodiment, the A-type segments are first calibrated to a desired global impedance and then the impedance of the B-type segments are matched to the impedance of the calibrated A-type segments. In one example embodiment, the A-type segments are calibrated to a desired global impedance and the impedance of the B-type segments is calibrated to a desired global impedance, where the calibrations may be performed in any order or at least partially concurrently.

Figure 6B:
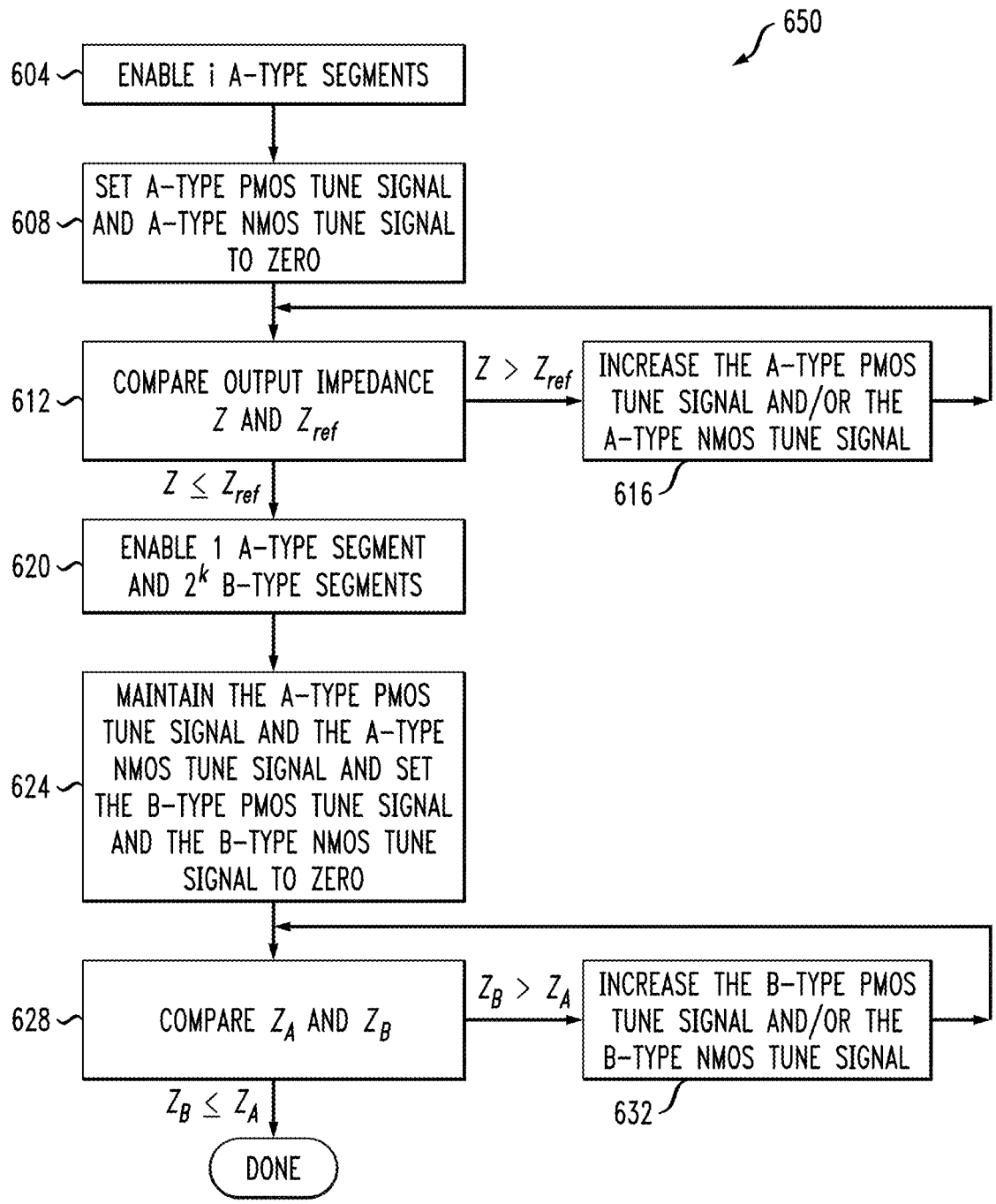
FIG. 6B is a flowchart for an example calibration method for the example configurations of FIGS. 4A and 4B, in accordance with an example embodiment.

FIG. 6B is a flowchart for an example calibration method 650 for the example configurations 400, 450 of FIGS. 4A and 4B, in accordance with an example embodiment. In one example embodiment, i A-type units are enabled, where i≥1 (operation 604). The value of i is an input to the calibration routine. Using a smaller value of i is beneficial if replicas of the DAC are used for calibration as it will require a smaller number of replica resistance units. Using a larger value of i is beneficial to average out the impact of random mismatch on the measured A-type resistance units. An A-type PMOS tune signal and an A-type NMOS tune signal are set to zero, where zero corresponds to the maximum impedance (operation 608). In one example embodiment, the A-type PMOS tune signal is an A-type PMOS binary tune signal (P<0:4>) and the A-type NMOS tune signal is an A-type NMOS binary tune signal (N<0:4>) where each binary tune signal includes five bits, as depicted in FIG. 5A. The resistance measured at the output of the DAC $$Z\left(Z = 1 \bigg/ \left(\frac{15}{RA} + \frac{15}{RB}\right)\right)$$

for the configuration 400 or $$Z = 1 \bigg/ \left(\frac{15}{TA} + \frac{7.5}{RB}\right)$$

for the configuration 450) and the target resistance $$Z_{ref} = Z_0 * \frac{(2^N - 1)}{i * 2^k}$$

are compared, where $Z_0$ represents the impedance of the channel (e.g., 50 Ohm), as part of the absolute global impedance calibration operation (operation 612). If $Z>Z_{ref}$, the A-type PMOS tune signal and/or the A-type NMOS tune signal are increased (operation 616) (for example, the A-type PMOS binary tune signal (P<0:4>) and/or the A-type NMOS binary tune signal (N<0:4>) may be incremented) and operation 612 is repeated; if $Z≤Z_{ref}$, one A-type resistance unit and $2^k$ B-type resistance units are enabled (operation 620). The A-type PMOS tune signal and the A-type NMOS tune signal are maintained at their present value, and a B-type PMOS tune signal and a B-type NMOS tune signal are set to zero (operation 624). Here, note that 0 corresponds to the value giving the maximum resistance (e.g., connecting the gate of the PFET to VDD and connecting the gate of the NFET to VS S). In one example embodiment, the B-type PMOS tune signal includes a B-type PMOS binary tune signal (P<0:1>) and a B-type PMOS analog tune signal and the B-type NMOS tune signal includes a B-type NMOS binary tune signal (N<0:1>) and a B-type NMOS analog tune signal, where each binary tune signal includes two bits, as depicted in FIG. 5A.

The output impedance $Z_A$ and $Z_B$ are compared, where $Z_A$ is the output impedance of one A-type resistance unit 408-2, and $Z_B$ is the output impedance of one B-type resistance unit 408-1, as part of the relative A/B calibration (operation 628). If $Z_B>Z_A$, the B-type PMOS tune signal and/or the B-type NMOS tune signal are increased (operation 632) and operation 628 is repeated; if $Z_B≤Z_A$, the calibration method 600 is complete.

In one example embodiment, the B-type PMOS analog tune signal and the B-type NMOS analog tune signal are also adjusted during one or more of the iterations of the operation 632. In one example embodiment, during operation 632, the B-type PMOS analog tune signal and the B-type NMOS analog tune signal are increased by, for example, 5% (if the corresponding analog tune signal is yet not at a maximum value; 5% is a non-limiting example and the skilled artisan can determine appropriate percentages for a given application heuristically, given the teachings herein). If either the B-type PMOS analog tune signal and the B-type NMOS analog tune signal are already set at the maximum value, the B-type PMOS analog tune signal and the B-type NMOS analog tune signal are reset to zero and the digital components of the B-type PMOS tune signal and the B-type NMOS tune signal are incremented.

In one example embodiment, during operation 632, the digital components of the B-type PMOS tune signal and the B-type NMOS tune signal are incremented. As described above, if the result of operation 628 is $Z_B>Z_A$, operation 632 is repeated, as depicted in FIG. 6B. If the result of operation 628 is $Z_B≤Z_A$, the digital component of the B-type PMOS tune signal and the B-type NMOS tune signal are decremented and the loop of operations 632 and 628 is repeated where, during operation 632, the analog components of the B-type PMOS tune signal and the B-type NMOS tune signal are increased by, for example, 5%. Once $Z_B≤Z_A$, as determined during operation 628, the method 650 ends. It is noted that, in addition to the example linear search, a dichotomy search is also contemplated in one or more embodiments.

FIG. 6B describes an example embodiment of the calibration where the A-type segments are first calibrated to a given absolute global impedance, and then the B-type segments are calibrated relative to the A-type segments. The cited order of operations is an example and non-limiting. In one example embodiment, the B-type segments are calibrated to an absolute reference impedance, and then the A-type segments are calibrated to match the impedance of the B-type segments. In one example embodiment, the A-type segments and the B-type segments are each calibrated to a given absolute reference impedance. The first proposed embodiment is advantageous because the A-type segment tuning is coarser (digital vs hybrid tuning) and the tuning to the absolute impedance needs to be less precise than the A/B resistance unit impedance matching. For example, if one precisely calibrates the B-type resistance units to an absolute reference $Z_{ref}$, and then attempts to calibrate the A-type segments to the B-type segments then, due to the coarser steps of the digital calibration, it may not be possible to set the impedance of the A-type resistance units to exactly $$\frac{Z_{ref}}{8},$$

causing DAC non-linearity.

Figure 7A:
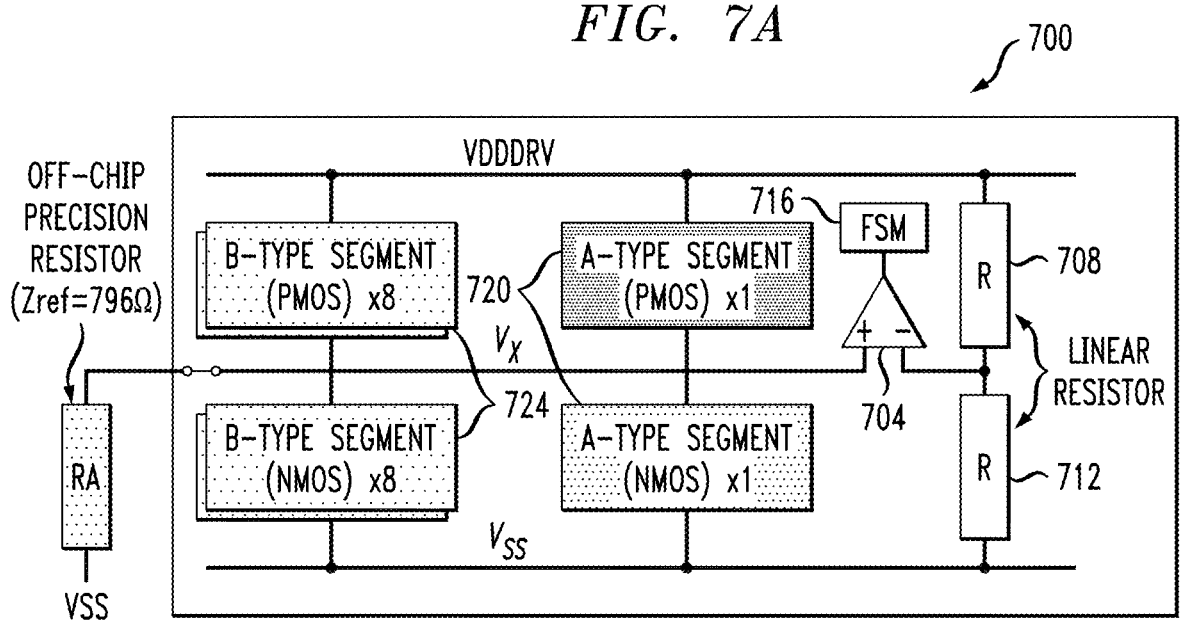
FIGS. 7A-7D illustrate the configurations of an example calibration evaluation circuit 700 during various operations of an example calibration method, in accordance with an example embodiment.

FIGS. 7A-7D illustrate the configurations of an example calibration evaluation circuit 700 during various operations of an example calibration method, in accordance with an example embodiment. In FIGS. 7A-7D and 8, all references to A-type resistance segments and B-type resistance segments correspond to a resistance segment, including a single unit, as illustrated in FIG. 4B, i.e., resistance segments 454-5 and 454-2, respectively. In a non-limiting example, $Z_{ref}$=796 Ohms (nominal value of one segment A) but other embodiments could use other values. The calibration evaluation circuit 700 is an on-chip replica of portions of the DAC wireline driver that is implemented for determining the calibration parameters. As depicted in FIG. 7A, a comparator 704 compares $V_x$ and $$\frac{V_{DD}}{2}$$

(generated by the voltage generator created by the two resistors 708, 712 which have equal values) while a finite state machine 716 monitors the output of the comparator 704 and controls the configuration of the calibration evaluation circuit 700. In one example embodiment, initially, only the PMOS FET(s) of switches 116 (see, FIGS. 4A and 4B) of one A-type resistance segment 720 are enabled and an off-chip precision resistor RA, which is selected to match the impedance of one A-type resistance segment 720, is connected to the V, node. (As noted, an RA of 796 Ohms is a non-limiting example; other embodiments could use other values.) The A-type PMOS tune signal (see FIG. 5A) is tuned until $V_x$ equals $$\frac{V_{DD}}{2}$$

(the pull-up and pull-down effect of the enabled A-type resistance segment 720 and the off-chip precision resistor RA, respectively, are equal).

Figure 7B:
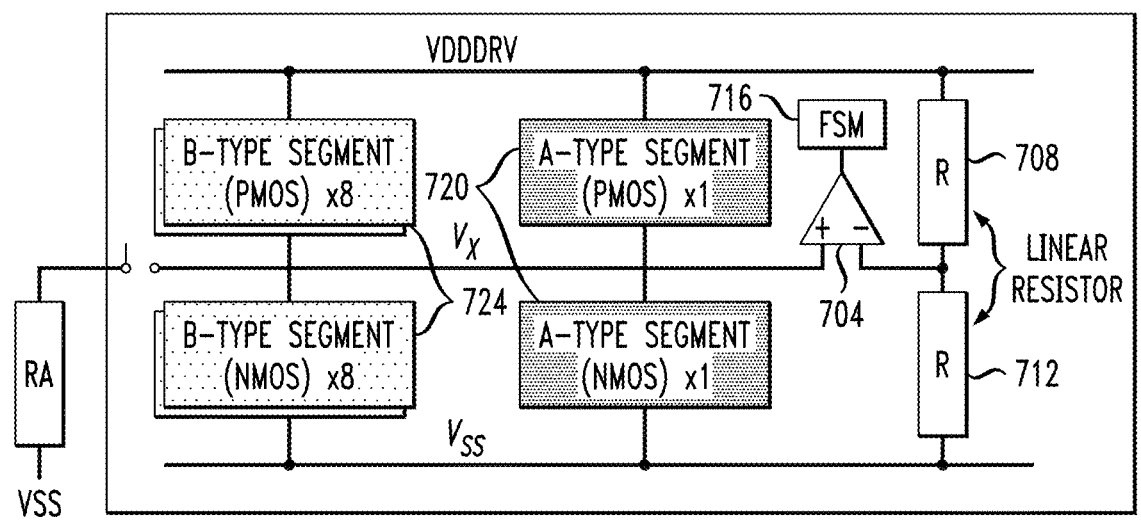

As depicted in FIG. 7B, the comparator 704 compares $V_x$ and $$\frac{V_{DD}}{2}$$

while both the PMOS FETs of switches 116 of one A-type resistance segment 720 and the NMOS FETs of switches 116 of one A-type resistance segment 720 are enabled and the off-chip precision resistor RA is disconnected. The A-type NMOS tune signal (see FIG. 5A) is tuned until $V_x$ equals $$\frac{V_{DD}}{2}.$$

Figure 7C:
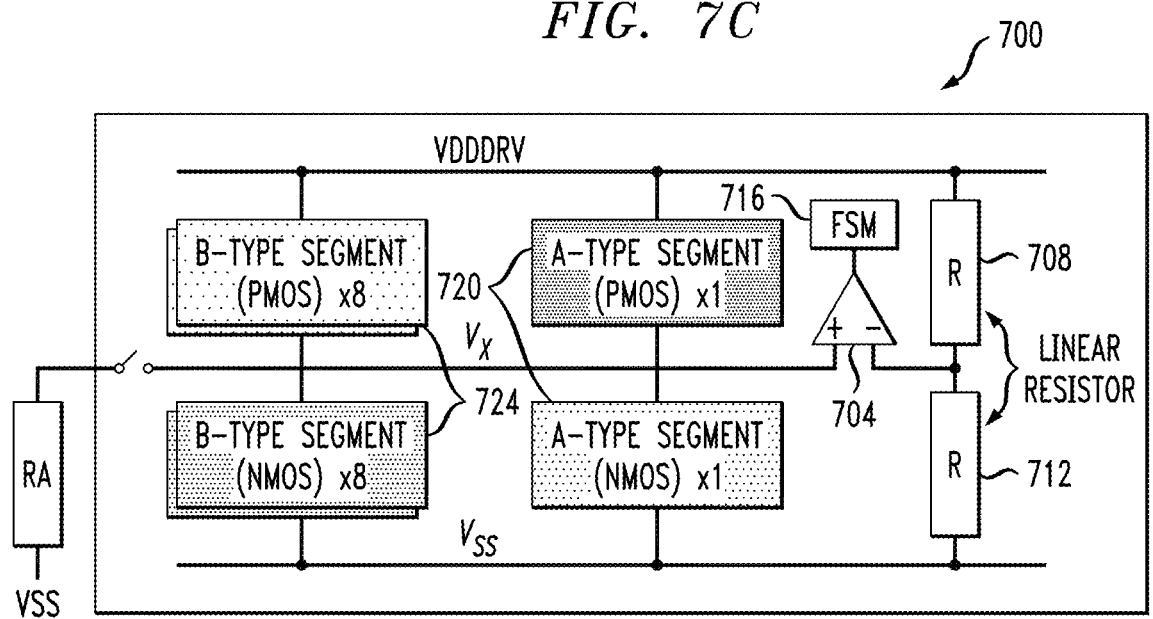

As depicted in FIG. 7C, the comparator 704 compares $V_x$ and $$\frac{V_{DD}}{2}$$

while only the PMOS FETs of switches 116 of an A-type resistance segment 720 and the NMOS FETs of switches 116 of the B-type resistance segments 724 are enabled and the off-chip precision resistor RA is disconnected. The B-type NMOS tune signal (see FIG. 5A) is tuned until $V_x$ equals $$\frac{V_{DD}}{2}.$$

Figure 7D:
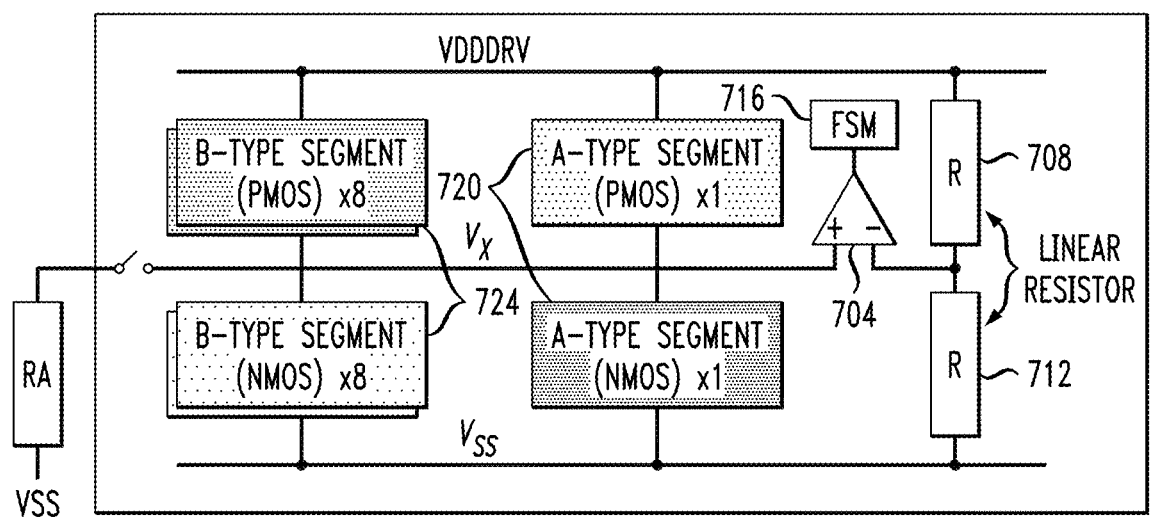

As depicted in FIG. 7D, the comparator 704 compares $V_x$ and $$\frac{V_{DD}}{2}$$

while only the NMOS FETs of switches 116 of an A-type resistance segment 720 and the PMOS FETs of switches 116 of the B-type resistance segments 724 are enabled and the off-chip precision resistor RA is disconnected. The B-type PMOS tune signal (see FIG. 5A) is tuned until $V_x$ equals $$\frac{V_{DD}}{2}.$$

Note that other orders of operation are possible, such as 1) calibrating the PMOS FETs of switches 116 of one A-type resistance segment 720 vs $Z_{ref}$; 2) calibrating the PMOS FETs of switches 116 of B-type resistance segments 724 vs $Z_{ref}$; 3) calibrating the NMOS FETs of switches 116 of A-type resistance segments 720 vs the PMOS FETs of switches 116 of B-type resistance segments 724; and 4) calibrating the NMOS FETs of switches 116 of B-type resistance segments 724 vs the PMOS FETs of switches 116 of A-type resistance segments 720.

FIG. 8 is a flowchart for an example method 850 for calibrating a DAC wireline driver, in accordance with an example embodiment. In the example embodiment of FIG. 8, the main DAC is used for calibration rather than a replica. During the calibration process, each segment can have one of three settings:

0: output connected to $V_{SS}$ via a resistor; (i.e., the input of the switch 116 is 1 and the B-type NMOS tune signal is set to a value different from "all 0").

1: output connected to $V_{DD}$ via a resistor; (i.e., the input of the switch 116 is 0 and the B-type PMOS tune signal Tune P is set to a value different from "all 1").

Z: hi-impedance; output not connected to $V_{DD}$ nor to $V_{SS}$. This can be accomplished by setting all headers and footers for the PMOS and NMOS FETs to open (i.e., the B-type NMOS tune signal is set to "all 0" and the B-type PMOS tune signal is set to "all 1").

In one example embodiment, the PMOS FET(s) of the switches 116 of one A-type resistance segment are calibrated by setting all A-type resistance segments to 1, setting all B-type resistance segments to Z, forcing the output to $$\frac{V_{DD}}{2},$$

and measuring me current $I_{out}$, where $$Z_{out} = \frac{V_{DD}}{2 * I_{out}}$$

(operation 854).

In one example embodiment, the NMOS FET(s) of the switches 116 of one A-type resistance segment are calibrated by setting all A-type resistance segments to 0, setting all B-type resistance segments to Z, forcing the output to $$\frac{V_{DD}}{2},$$

and measuring the current $I_{out}$, where $$Z_{out} = \frac{V_{DD}}{2 * I_{out}}$$

(operation 858).

In one example embodiment, the NMOS FET(s) of the switches 116 of the B-type resistance segments are calibrated by setting one A-type resistance segment to 1, setting the remaining A-type resistance segments to Z, setting all B-type resistance segments to 0, forcing the output to $$\frac{V_{DD}}{2},$$

measuring the current $I_{out}$, and adjusting the B-type resistance segments until $I_{out}=0$ (operation 862).

In one example embodiment, the PMOS FET(s) of the switches 116 of the B-type resistance segments are calibrated by setting one A-type resistance segment to 0, setting the remaining A-type resistance segments to Z, setting all B-type resistance segments to 1, forcing the output to $$\frac{V_{DD}}{2},$$

measuring the current $I_{out}$, and adjusting the B-type resistance segments until $I_{out}=0$ (operation 866).

In one example embodiment, the steps of FIGS. 7C and 7D of the method are repeated at runtime with fine tuning using analog control of the B-type resistance segments to account for runtime temperature drift (in one or more embodiments, it is appropriate to pay more attention to A:B matching than absolute impedance matching, since the former affects the linearity of the DAC device). In one example embodiment, at runtime, only the analog tuning would be adjusted for stability reasons, as the digital tuning is inherently much more coarse than the analog tuning.

Given the discussion thus far, it will be appreciated that, in general terms, an exemplary method for calibrating an apparatus, according to an aspect of the invention, includes the operations of enabling one or more A-type resistance segments 404-5, each A-type resistance segment 404-5 comprising one or more A-type switches 116, and at least one A-type linear resistor 412-2 coupled to the one or more A-type switches 116 via a first terminal of the at least one A-type linear resistor 412-2; calibrating an impedance of the one or more A-type resistance segments 404-5 to match a first given impedance; enabling one or more B-type resistance segments 404-1, each B-type resistance segment 404-1 comprising one or more B-type switches 116, and at least one B-type linear resistor 412-1 coupled to a proper subset of the one or more B-type switches 116 via a first terminal of the at least one B-type linear resistor 412-1; and calibrating an impedance of the one or more B-type resistance segments 404-1 to match a second given impedance.

In one example embodiment, the calibrating the impedance of the one or more A-type resistance segments to match the first given impedance further comprises enabling one or more of the A-type resistance segments, setting an A-type tuning signal of a calibration control circuit for the one or more A-type resistance segments to zero, and increasing the A-type tuning signal until the impedance of the one or more A-type resistance segments is at least one of less than and equal to the first given impedance; and the calibrating the impedance of the one or more B-type resistance segments to match the second given impedance further comprises enabling one of the one or more A-type resistance segments and a plurality of the B-type resistance segments, setting a B-type tuning signal of a calibration control circuit for the one or more B-type resistance segments to zero, and increasing the B-type tuning signal until the impedance of the one or more B-type resistance segments is at least one of less than and equal to the impedance of the one of the previously calibrated A-type resistance segments.

In one example embodiment, the increasing of the A-type tuning signal until the impedance of the one or more A-type resistance segments is at least one of less than and equal to the first given impedance further comprises increasing a P-channel metal-oxide semiconductor (PMOS) component of the A-type tuning signal while enabling a PMOS section of the one or more A-type resistance segments until the impedance of the PMOS section of the one or more A-type resistance segments matches a specified impedance; and increasing an N-channel metal-oxide semiconductor (NMOS) component of the A-type tuning signal while enabling the PMOS section and an NMOS section of the one or more A-type resistance segments until the impedance of the NMOS section of the one or more A-type resistance segments matches the impedance of the PMOS section of the one or more A-type resistance segments.

In one example embodiment, the increasing the B-type tuning signal until the impedance of the one or more B-type resistance segments is at least one of less than and equal to the impedance of the one or more A-type resistance segments further comprises increasing an N-channel metal-oxide semiconductor (NMOS) component of the B-type tuning signal while enabling the P-channel metal-oxide semiconductor (PMOS) section of the one or more A-type resistance segments and an NMOS section of the one or more B-type resistance segments until the impedance of the PMOS section of the one or more A-type resistance segments matches the impedance of the NMOS section of the one or more B-type resistance segments; and increasing a PMOS component of the B-type tuning signal while enabling the NMOS section of the one or more A-type resistance segments and a PMOS section of the one or more B-type resistance segments until the impedance of the PMOS section of the one or more B-type resistance segments matches the impedance of the NMOS section of the one or more A-type resistance segments.

In one example embodiment, the increasing the B-type tuning signal until the impedance of the one or more B-type resistance segments is at least one of less than and equal to the impedance of the one or more A-type resistance segments further comprises incrementing a digital portion of the B-type tuning signal; and increasing an analog portion of the B-type tuning signal.

In one example embodiment, the method further comprises decrementing the digital portion of the B-type tuning signal after the impedance of the one or more B-type resistance segments is less than the impedance of the one or more A-type resistance segments and before the increasing the analog portion of the B-type tuning signal.

In one example embodiment, the method further comprises periodically adjusting the analog portion of the B-type tuning signal at runtime.

In one aspect, an apparatus comprises one or more A-type resistance segments 404-5, wherein each A-type resistance segment 404-5 comprises one or more A-type switches 116, at least one A-type linear resistor 412-2 coupled to the one or more A-type switches 116 via a first terminal of the at least one A-type linear resistor 412-2, at least one A-type tunable header unit 504 coupled to the one or more A-type switches 116 via a first terminal of the at least one A-type tunable header unit 504 and coupled to a first supply via a second terminal of the at least one A-type tunable header unit 504, and at least one A-type tunable footer unit 508 coupled to the one or more A-type switches 116 via a first terminal of the at least one A-type tunable footer unit 508 and coupled to a second supply via a second terminal of the at least one A-type tunable footer unit 508, wherein the at least one A-type tunable footer unit 508 and the at least one A-type tunable header unit 504 provide a tuning range sufficient to match an impedance of each A-type resistance segment 404-5 to a first given impedance; one or more B-type resistance segments 404-1, wherein each B-type resistance segment 404-1 comprises one or more B-type switches 116, and at least one B-type linear resistor 412-1 coupled to at least a proper subset of the one or more B-type switches 116 via a first terminal of the at least one B-type linear resistor 412-1, at least one B-type tunable header unit 512, 516 coupled to the one or more B-type switches 116 via a first terminal of the at least one B-type tunable header unit 512, 516 and coupled to the first supply via a second terminal of the at least one B-type tunable header unit 512, 516, and at least one B-type tunable footer 520, 524 unit coupled to the one or more B-type switches 116 via a first terminal of the at least one B-type tunable footer unit 520, 524 and coupled to the second supply via a second terminal of the at least one B-type tunable footer unit 520, 524, wherein the at least one B-type tunable footer unit 520, 524 and the at least one B-type tunable header unit 512, 516 provide a tuning range sufficient to match an impedance of each B-type resistance segment 404-1 to a second given impedance; wherein the one or more A-type resistance segments 404-5 implement k most significant bits of an N-bit digital-to-analog converter of the apparatus and the one or more B-type resistance segments 404-1 implement N-k least significant bits of the N-bit digital-to-analog converter, wherein a resistance value of the at least one A-type linear resistor 412-2 and a resistance value of the at least one B-type linear resistor 412-1 are unequal, and wherein second terminals of the at least one A-type linear resistor 412-2 and the at least one B-type linear resistor 412-1 are coupled together.

In one example embodiment, one or more A-type predrivers 112 are coupled to the one or more A-type switches 116 and one or more B-type predrivers 112 are coupled to the one or more B-type switches 116.

In one example embodiment, a count of the one or more B-type predrivers equals a count of the one or more B-type switches for each B-type resistance segment and only the proper subset of the B-type switches of each B-type resistance segment drive the corresponding B-type linear resistor.

In one example embodiment, an output of a serializer circuit drives a corresponding A-type predriver of the one or more A-type predrivers or a corresponding B-type predriver of the one or more B-type predrivers.

In one example embodiment, a comparator 704 is configured to monitor the impedance of the one or more A-type resistance segments and the one or more B-type resistance segments.

In one example embodiment, a tuning range provided by the at least one A-type tunable footer unit and the at least one A-type tunable header unit and a tuning range provided by the at least one B-type tunable footer unit and the at least one B-type tunable header unit are comparable.

In one example embodiment, a ratio of an impedance of the one or more A-type switches of each A-type resistance segment to the at least one A-type linear resistor of each A-type resistance segment matches a ratio of an impedance of the one or more B-type switches of each B-type resistance segment, which are connected to the corresponding linear resistor, to the at least one B-type linear resistor of each B-type resistance segment.

In one example embodiment, a B-type resistance segment corresponding to a least significant bit of the N-bit digital-to-analog converter of the apparatus is configured in a single-ended manner.

In one example embodiment, the B-type linear resistor of the B-type resistance segment corresponding to the least significant bit of the N-bit digital-to-analog converter has a same resistance value as the B-type linear resistor of the resistance segment corresponding to a second least significant bit of the N-bit digital-to-analog converter.

In one example embodiment, a plurality of most significant bits of the apparatus are represented by thermometer-encoded input data, wherein a proper subset of the A-type resistance segments are equally weighted, and the thermometer-encoded input data is applied to the equally weighted segments.

In one example embodiment, one or more additional types of resistance segments comprise one or more unique-type resistance units, wherein each unique-type resistance unit comprises one or more switches, at least one unique-type linear resistor coupled to the one or more switches via a first terminal of the at least one unique-type linear resistor, and a plurality of unique-type headers and a plurality of unique-type footers, the plurality of unique-type headers and the plurality of unique-type footers coupled to the one or more unique-type resistance segments.

In one example embodiment, the apparatus includes a replica of one of the one or more A-type resistance segments, a replica of the one or more B-type resistance segments, a voltage generation circuit, and a comparator, a first input of the comparator coupled to a first terminal of the voltage generation circuit and a second input of the comparator coupled to a terminal of the replica of the A-type resistance segment and to a terminal of the replica of the one or more B-type resistance segments.

It should be noted that the skilled artisan, given the teachings herein, will be able to implement the illustrated embodiments using digital circuitry (such as in the form of an integrated circuit (IC)). For example, a design process as discussed with respect to FIG. can be used. The skilled artisan will be able to effectuate digital circuit implementations suitable for the various components in the block diagrams in different families of digital logic.

In one example embodiment, at least one of the headers 516 and at least one of the footers 524 are configured for analog tuning.

In one example embodiment, at least one of the headers 512 and at least one of the footers 520 are configured for digital tuning.

In one example embodiment, all of the headers 512, 516 and all of the footers 520, 524 are configured for analog tuning.

In one example embodiment, all of the headers 512, 516 and all of the footers 520, 524 are configured for digital tuning.

In one example embodiment, during the calibration process, only one A-type resistance segment is enabled. In one example embodiment, during the calibration process, only one B-type resistance segment is enabled. In one example embodiment, during the calibration process, a plurality of B-type resistance segments are enabled.

In one example embodiment, a first supply voltage source is coupled to a second terminal of an A-type tunable header unit and a second terminal of a B-type tunable header unit, and a second supply voltage source is coupled to a second terminal of an A-type tunable footer unit and a second terminal of a B-type tunable footer unit (in this aspect, the supply voltage sources are considered as part of the apparatus). In another example embodiment, a first supply voltage terminal is coincident with a second terminal of an A-type tunable header unit and a second terminal of a B-type tunable header unit, and a second supply voltage terminal is coincident with a second terminal of an A-type tunable footer unit and a second terminal of a B-type tunable footer unit (in this aspect, the supply voltage sources are considered as external to the apparatus).

Figure 9:
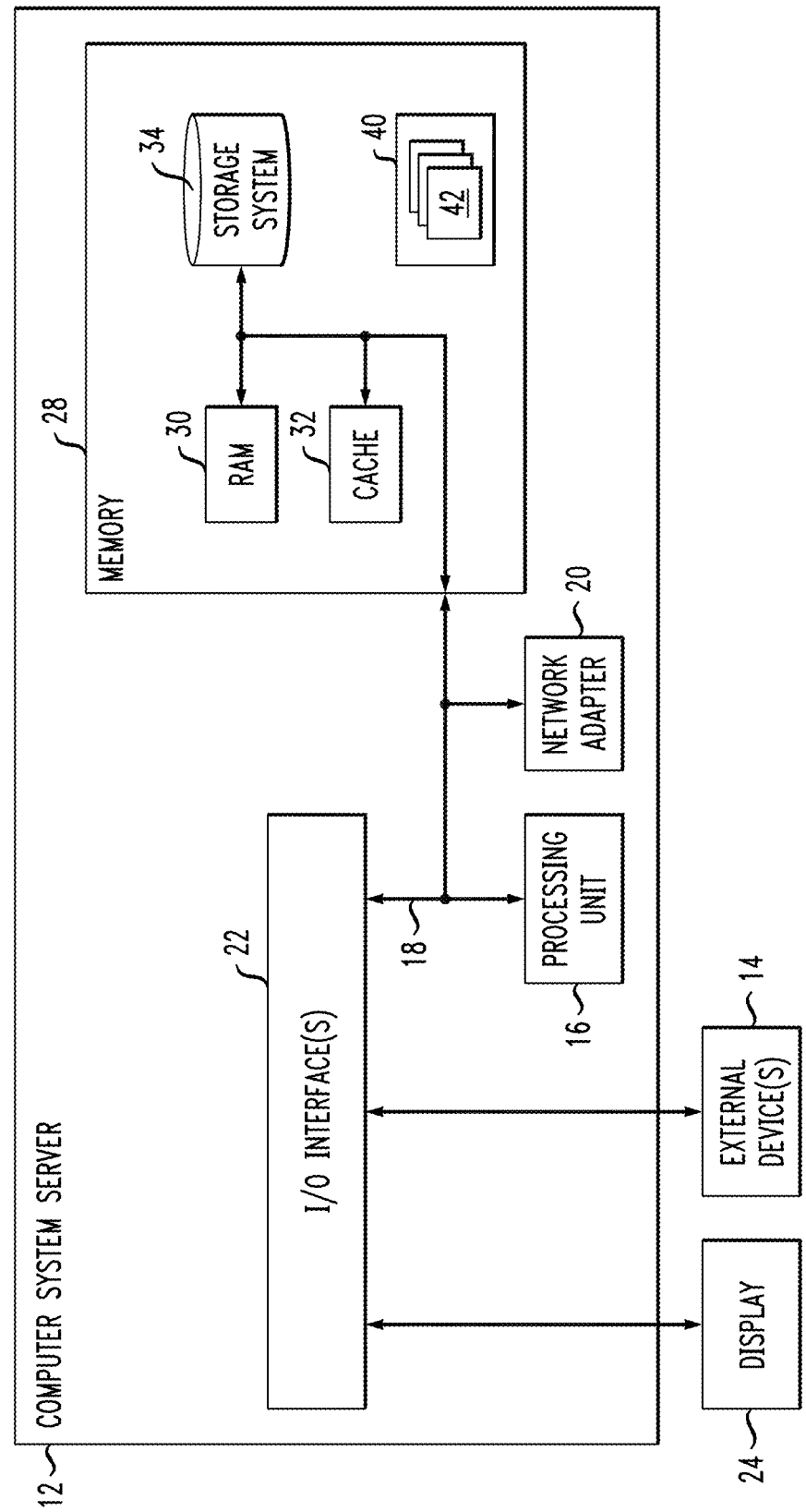
FIG. 9 depicts a computer system that could implement a design process such as that shown in FIG. 10.

FIG. 9 depicts a computer system 12 that can be used, for example, to carry out a design process as described below with respect to FIG. 10. Computer system 12 includes, for example, one or more processors or processing units 16, a system memory 28, and a bus 18 that couples various system components including system memory 28 to processor 16. Element 16 can connect to the bus, for example, with suitable bus interface units.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random-access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below memory 28 may include at least one program product having a set (e.g., at least one) of program modules that are configured to carry out, e.g., a design process as shown in FIG. 10.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out software-implemented functions and/or methodologies.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, and external disk drive arrays, RAID systems, tape drives, and data archival storage systems, etc.

Still with reference to FIG. 9, note processor 16, memory 28, and an input/output interface 22 to a display 24 and external device(s) 14 such as a keyboard, a pointing device, or the like. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory) 30, ROM (read only memory), a fixed memory device (for example, hard drive 34), a removable memory device (for example, diskette), a flash memory and the like. In addition, the phrase "input/output interface" as used herein, is intended to contemplate an interface to, for example, one or more mechanisms for inputting data to the processing unit (for example, mouse), and one or more mechanisms for providing results associated with the processing unit (for example, printer). The processor 16, memory 28, and input/output interface 22 can be interconnected, for example, via bus 18 as part of a data processing unit 12. Suitable interconnections, for example via bus 18, can also be provided to a network interface 20, such as a network card, which can be provided to interface with a computer network, and to a media interface, such as a diskette or CD-ROM drive, which can be provided to interface with suitable media.

Accordingly, computer software including instructions or code for performing desired tasks, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 16 coupled directly or indirectly to memory elements 28 through a system bus 18. The memory elements can include local memory employed during actual implementation of the program code, bulk storage, and cache memories 32 which provide temporary storage of at least some program code in order to reduce the number of times code must be retrieved from bulk storage during implementation.

Input/output or I/O devices (including but not limited to keyboards, displays, pointing devices, and the like) can be coupled to the system either directly or through intervening I/O controllers.

Network adapters 20 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 12 as shown in FIG. 9) running a server program. It will be understood that such a physical server may or may not include a display and keyboard. Furthermore, FIG. 9 is representative of a conventional general-purpose computer that could be used, for example, to implement aspects of the design process described below.

Exemplary Design Process Used in Semiconductor Design, Manufacture, and/or Test

One or more embodiments of hardware in accordance with aspects of the invention can be implemented using techniques for semiconductor integrated circuit design simulation, test, layout, and/or manufacture. In this regard, FIG. 10 shows a block diagram of an exemplary design flow 7000 used for example, in semiconductor IC logic design, simulation, test, layout, and manufacture. Design flow 7000 includes processes, machines and/or mechanisms for processing design structures or devices to generate logically or otherwise functionally equivalent representations of design structures and/or devices, such as those disclosed herein or the like. The design structures processed and/or generated by design flow 7000 may be encoded on machine-readable storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 7000 may vary depending on the type of representation being designed. For example, a design flow 7000 for building an application specific IC (ASIC) may differ from a design flow 7000 for designing a standard component or from a design flow 7000 for instantiating the design into a programmable array, for example a programmable gate array (PGA) or a field programmable gate array (FPGA) offered by Altera® Inc. or Xilinx® Inc.

Figure 10:
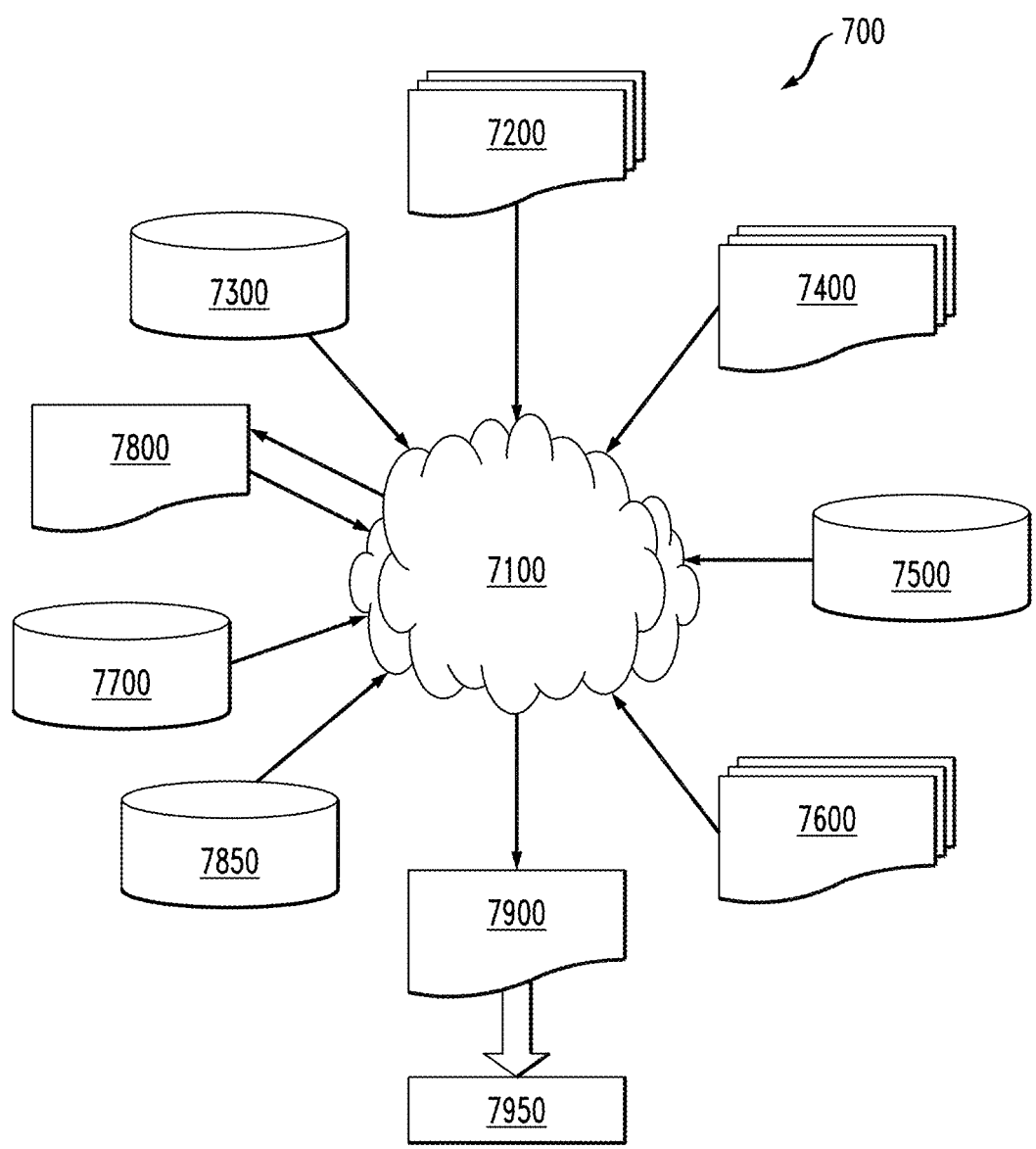
FIG. 10 is a flow diagram of a design process used in semiconductor design, manufacture, and/or test.

FIG. 10 illustrates multiple such design structures including an input design structure 7200 that is preferably processed by a design process 7100. Design structure 7200 may be a logical simulation design structure generated and processed by design process 7100 to produce a logically equivalent functional representation of a hardware device. Design structure 7200 may also or alternatively comprise data and/or program instructions that when processed by design process 7100, generate a functional representation of the physical structure of a hardware device. Whether representing functional and/or structural design features, design structure 7200 may be generated using electronic computer-aided design (ECAD) such as implemented by a core developer/designer. When encoded on a gate array or storage medium or the like, design structure 7200 may be accessed and processed by one or more hardware and/or software modules within design process 7100 to simulate or otherwise functionally represent an electronic component, circuit, electronic or logic module, apparatus, device, or system. As such, design structure 7200 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher-level design languages such as C or C++.

Design process 7100 preferably employs and incorporates hardware and/or software modules for synthesizing, translating, or otherwise processing a design/simulation functional equivalent of components, circuits, devices, or logic structures to generate a Netlist 7800 which may contain design structures such as design structure 7200. Netlist 7800 may comprise, for example, compiled or otherwise processed data structures representing a list of wires, discrete components, logic gates, control circuits, I/O devices, models, etc. that describes the connections to other elements and circuits in an integrated circuit design. Netlist 7800 may be synthesized using an iterative process in which netlist 7800 is resynthesized one or more times depending on design specifications and parameters for the device. As with other design structure types described herein, netlist 7800 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or other suitable memory.

Design process 7100 may include hardware and software modules for processing a variety of input data structure types including Netlist 7800. Such data structure types may reside, for example, within library elements 7300 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 7400, characterization data 7500, verification data 7600, design rules 7700, and test data files 7850 which may include input test patterns, output test results, and other testing information. Design process 7100 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 7100 without deviating from the scope and spirit of the invention. Design process 7100 may also include modules for performing standard circuit design processes such as timing analysis, verification, design rule checking, place and route operations, etc.

Design process 7100 employs and incorporates logic and physical design tools such as HDL compilers and simulation model build tools to process design structure 7200 together with some or all of the depicted supporting data structures along with any additional mechanical design or data (if applicable), to generate a second design structure 7900. Design structure 7900 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 7200, design structure 7900 preferably comprises one or more files, data structures, or other computer-encoded data or instructions that reside on data storage media and that when processed by an ECAD system generate a logically or otherwise functionally equivalent form of one or more IC designs or the like as disclosed herein. In one embodiment, design structure 7900 may comprise a compiled, executable HDL simulation model that functionally simulates the devices disclosed herein.

Design structure 7900 may also employ a data format used for the exchange of layout data of integrated circuits and/or symbolic data format (e.g., information stored in a GDSII (GDS2), GL1, OASIS, map files, or any other suitable format for storing such design data structures). Design structure 7900 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described herein. Design structure 7900 may then proceed to a stage 7950 where, for example, design structure 7900: proceeds to tape-out, is released to manufacturing, is released to a mask house, is sent to another design house, is sent back to the customer, etc.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:
one or more A-type resistance segments, wherein each A-type resistance segment comprises one or more A-type switches, at least one A-type linear resistor coupled to the one or more A-type switches via a first terminal of the at least one A-type linear resistor, at least one A-type tunable header unit coupled to the one or more A-type switches via a first terminal of the at least one A-type tunable header unit and coupled to a first supply via a second terminal of the at least one A-type tunable header unit, and at least one A-type tunable footer unit coupled to the one or more A-type switches via a first terminal of the at least one A-type tunable footer unit and coupled to a second supply via a second terminal of the at least one A-type tunable footer unit, wherein the at least one A-type tunable footer unit and the at least one A-type tunable header unit provide a tuning range sufficient to match an impedance of each A-type resistance segment to a first given impedance;
one or more B-type resistance segments, wherein each B-type resistance segment comprises one or more B-type switches, and at least one B-type linear resistor coupled to at least a proper subset of the one or more B-type switches via a first terminal of the at least one B-type linear resistor, at least one B-type tunable header unit coupled to the one or more B-type switches via a first terminal of the at least one B-type tunable header unit and coupled to the first supply via a second terminal of the at least one B-type tunable header unit, and at least one B-type tunable footer unit coupled to the one or more B-type switches via a first terminal of the at least one B-type tunable footer unit and coupled to the second supply via a second terminal of the at least one B-type tunable footer unit, wherein the at least one B-type tunable footer unit and the at least one B-type tunable header unit provide a tuning range sufficient to match an impedance of each B-type resistance segment to a second given impedance;
wherein the one or more A-type resistance segments implement k most significant bits of an N-bit digital-to-analog converter of the apparatus and the one or more B-type resistance segments implement N-k least significant bits of the N-bit digital-to-analog converter, wherein a resistance value of the at least one A-type linear resistor and a resistance value of the at least one B-type linear resistor are unequal, and wherein second terminals of the at least one A-type linear resistor and the at least one B-type linear resistor are coupled together.

2. The apparatus of claim 1, further comprising one or more A-type predrivers coupled to the one or more A-type switches and one or more B-type predrivers coupled to the one or more B-type switches.

3. The apparatus of claim 2, wherein a count of the one or more B-type predrivers equals a count of the one or more B-type switches for each B-type resistance segment and wherein only the proper subset of the B-type switches of each B-type resistance segment drive the corresponding B-type linear resistor.

4. The apparatus of claim 2, further comprising a serializer circuit, each output of the serializer circuit driving a corresponding A-type predriver of the one or more A-type predrivers or a corresponding B-type predriver of the one or more B-type predrivers.

5. The apparatus of claim 1, further comprising a comparator configured to monitor the impedance of the one or more A-type resistance segments and the one or more B-type resistance segments.

6. The apparatus of claim 1, wherein a tuning range provided by the at least one A-type tunable footer unit and the at least one A-type tunable header unit and a tuning range provided by the at least one B-type tunable footer unit and the at least one B-type tunable header unit are comparable.

7. The apparatus of claim 1, wherein a ratio of an impedance of the one or more A-type switches of each A-type resistance segment to the at least one A-type linear resistor of each A-type resistance segment matches a ratio of an impedance of the one or more B-type switches of each B-type resistance segment, which are connected to the corresponding linear resistor, to the at least one B-type linear resistor of each B-type resistance segment.

8. The apparatus of claim 1, wherein a B-type resistance segment corresponding to a least significant bit of the N-bit digital-to-analog converter of the apparatus is configured in a single-ended manner.

9. The apparatus of claim 8, wherein the B-type linear resistor of the B-type resistance segment corresponding to the least significant bit of the N-bit digital-to-analog converter has a same resistance value as the B-type linear resistor of the resistance segment corresponding to a second least significant bit of the N-bit digital-to-analog converter.

10. The apparatus of claim 1, wherein a plurality of most significant bits of the apparatus are represented by thermometer-encoded input data, wherein a proper subset of the A-type resistance segments are equally weighted, and the thermometer-encoded input data is applied to the equally weighted segments.

11. The apparatus of claim 1, further comprising one or more additional types of resistance segments, each additional type of segment comprising one or more unique-type resistance units, wherein each unique-type resistance unit comprises one or more switches, at least one unique-type linear resistor coupled to the one or more switches via a first terminal of the at least one unique-type linear resistor, and a plurality of unique-type headers and a plurality of unique-type footers, the plurality of unique-type headers and the plurality of unique-type footers coupled to the one or more unique-type resistance segments.

12. The apparatus of claim 1, further comprising:
a replica of one of the one or more A-type resistance segments;
a replica of the one or more B-type resistance segments;
a voltage generation circuit; and
a comparator, a first input of the comparator coupled to a first terminal of the voltage generation circuit and a second input of the comparator coupled to a terminal of the replica of the A-type resistance segment and to a terminal of the replica of the one or more B-type resistance segments.

13. A method for calibrating an apparatus comprising:
enabling one or more A-type resistance segments, each A-type resistance segment comprising one or more A-type switches, and at least one A-type linear resistor coupled to the one or more A-type switches via a first terminal of the at least one A-type linear resistor;
calibrating an impedance of the one or more A-type resistance segments to match a first given impedance;
enabling one or more B-type resistance segments, each B-type resistance segment comprising one or more B-type switches, and at least one B-type linear resistor coupled to a proper subset of the one or more B-type switches via a first terminal of the at least one B-type linear resistor; and
calibrating an impedance of the one or more B-type resistance segments to match a second given impedance.

14. The method of claim 13, wherein:
the calibrating the impedance of the one or more A-type resistance segments to match the first given impedance further comprises:
enabling one or more of the A-type resistance segments;
setting an A-type tuning signal of a calibration control circuit for the one or more A-type resistance segments to zero; and
increasing the A-type tuning signal until the impedance of the one or more A-type resistance segments is at least one of less than and equal to the first given impedance; and
the calibrating the impedance of the one or more B-type resistance segments to match the second given impedance further comprises:
enabling one of the one or more A-type resistance segments and a plurality of the B-type resistance segments;
setting a B-type tuning signal of a calibration control circuit for the one or more B-type resistance segments to zero; and
increasing the B-type tuning signal until the impedance of the one or more B-type resistance segments is at least one of less than and equal to the impedance of the one of the previously calibrated A-type resistance segments.

15. The method of claim 14, wherein the increasing of the A-type tuning signal until the impedance of the one or more A-type resistance segments is at least one of less than and equal to the first given impedance further comprises:
increasing a P-channel metal-oxide semiconductor (PMOS) component of the A-type tuning signal while enabling a PMOS section of the one or more A-type resistance segments until the impedance of the PMOS section of the one or more A-type resistance segments matches a specified impedance; and
increasing an N-channel metal-oxide semiconductor (NMOS) component of the A-type tuning signal while enabling the PMOS section and an NMOS section of the one or more A-type resistance segments until the impedance of the NMOS section of the one or more A-type resistance segments matches the impedance of the PMOS section of the one or more A-type resistance segments.

16. The method of claim 15, wherein the increasing the B-type tuning signal until the impedance of the one or more B-type resistance segments is at least one of less than and equal to the impedance of the one or more A-type resistance segments further comprises:
increasing an N-channel metal-oxide semiconductor (NMOS) component of the B-type tuning signal while enabling the P-channel metal-oxide semiconductor (PMOS) section of the one or more A-type resistance segments and an NMOS section of the one or more B-type resistance segments until the impedance of the PMOS section of the one or more A-type resistance segments matches the impedance of the NMOS section of the one or more B-type resistance segments; and increasing a PMOS component of the B-type tuning signal while enabling the NMOS section of the one or more A-type resistance segments and a PMOS section of the one or more B-type resistance segments until the impedance of the PMOS section of the one or more B-type resistance segments matches the impedance of the NMOS section of the one or more A-type resistance segments.

17. The method of claim 14, wherein the increasing the B-type tuning signal until the impedance of the one or more B-type resistance segments is at least one of less than and equal to the impedance of the one or more A-type resistance segments further comprises:

incrementing a digital portion of the B-type tuning signal; and increasing an analog portion of the B-type tuning signal.

18. The method of claim 17, further comprising decrementing the digital portion of the B-type tuning signal after the impedance of the one or more B-type resistance segments is less than the impedance of the one or more A-type resistance segments and before the increasing the analog portion of the B-type tuning signal.

19. The method of claim 17, further comprising periodically adjusting the analog portion of the B-type tuning signal at runtime.

* * * * *